(12) United States Patent
Lee et al.

(10) Patent No.: US 12,423,178 B2
(45) Date of Patent: Sep. 23, 2025

(54) STORAGE DEVICE INCLUDING A READ RECLAIM MODULE AND A RECLAIM OPERATION METHOD THEREOF

(71) Applicant: SAMSUNG ELECTRONICS CO., LTD., Suwon-si (KR)

(72) Inventors: Dongho Lee, Suwon-si (KR); Sewoong Lee, Suwon-si (KR); Youn-Soo Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 80 days.

(21) Appl. No.: 18/420,849

(22) Filed: Jan. 24, 2024

(65) Prior Publication Data

US 2024/0411641 A1 Dec. 12, 2024

(30) Foreign Application Priority Data

Jun. 12, 2023 (KR) .......................... 10-2023-0075157

(51) Int. Cl.
*G06F 11/10* (2006.01)
*G06F 11/07* (2006.01)
(Continued)

(52) U.S. Cl.
CPC ........ *G06F 11/1016* (2013.01); *G06F 11/076* (2013.01); *G06F 11/1068* (2013.01); *G06F 13/1668* (2013.01); *G11C 5/147* (2013.01); *G11C 7/1057* (2013.01); *G11C 7/1069* (2013.01); *G11C 7/20* (2013.01);
(Continued)

(58) Field of Classification Search
CPC ............... G06F 11/1016; G06F 11/076; G06F 11/1068; G06F 13/1668; G11C 5/147; G11C 7/1057; G11C 7/1069; G11C 7/20; G11C 8/08; G11C 16/0483; G11C 16/08; G11C 16/26; G11C 16/3418; G11C 16/3431
USPC .... 714/764, 773, 768, 763; 711/3, 104, 113, 711/118–120, 126, 144, 154
See application file for complete search history.

(56) References Cited

U.S. PATENT DOCUMENTS 9,171,620 B2 10/2015 Avila et al.
9,679,662 B1 * 6/2017 Hashimoto .............. G11C 8/12
(Continued)

OTHER PUBLICATIONS

Yang et al., Garbage Collection and Wear Leveling for Flash Memory: Past and Future, 2014, IEEE, pp. 66-73. (Year: 2014).*
(Continued)

*Primary Examiner* — John J Tabone, Jr.
(74) *Attorney, Agent, or Firm* — MORGAN, LEWIS & BOCKIUS LLP

(57) ABSTRACT

A storage device including: a flash memory including a selected word line and an adjacent word line adjacent to the selected word line; and a memory controller configured to provide a select read voltage to the selected word line and a pass voltage to the adjacent word line during a read operation, the pass voltage being higher than the select read voltage, and wherein the memory controller is further configured to determine whether the selected word line is a hot spot read word line based on a deterioration level of the adjacent word line, and perform a word line reclaim operation for the adjacent word line when the selected word line is the hot spot read word line.

20 Claims, 16 Drawing Sheets

(51) Int. Cl.
*G06F 13/16* (2006.01)
*G11C 5/14* (2006.01)
*G11C 7/10* (2006.01)
*G11C 7/20* (2006.01)
*G11C 8/08* (2006.01)
*G11C 16/04* (2006.01)
*G11C 16/08* (2006.01)
*G11C 16/26* (2006.01)
*G11C 16/34* (2006.01)

(52) U.S. Cl.
CPC ............ *G11C 8/08* (2013.01); *G11C 16/0483* (2013.01); *G11C 16/08* (2013.01); *G11C 16/26* (2013.01); *G11C 16/3418* (2013.01); *G11C 16/3431* (2013.01)

(56) References Cited

U.S. PATENT DOCUMENTS

| | | | |
|---|---|---|---|
| 10,340,947 B2* | 7/2019 | Oh | H03M 13/611 |
| 10,373,695 B2 | 8/2019 | Barndt et al. | |
| 11,169,747 B2 | 11/2021 | Muchherla et al. | |
| 12,001,709 B2* | 6/2024 | Kim | G06F 3/0619 |
| 2014/0355345 A1* | 12/2014 | Avila | G06F 11/1048 |
| | | | 365/185.09 |
| 2015/0355845 A1* | 12/2015 | Lee | G06F 3/0659 |
| | | | 711/103 |
| 2017/0371742 A1* | 12/2017 | Shim | G06F 11/1048 |
| 2018/0150261 A1* | 5/2018 | Nam | G06F 3/0652 |
| 2018/0373460 A1* | 12/2018 | Park | G06F 3/0659 |
| 2019/0214091 A1* | 7/2019 | Lee | G11C 16/30 |
| 2020/0310896 A1* | 10/2020 | Lee | G06F 11/3037 |
| 2021/0383875 A1* | 12/2021 | Lee | G11C 29/00 |
| 2022/0179795 A1 | 6/2022 | Sharifi et al. | |
| 2022/0301637 A1 | 9/2022 | Tehrani et al. | |
| 2022/0392516 A1* | 12/2022 | Cha | G11C 29/4401 |
| 2023/0018605 A1* | 1/2023 | Kim | G11C 16/32 |
| 2023/0036616 A1* | 2/2023 | Kim | G06F 3/0649 |
| 2024/0071545 A1* | 2/2024 | Oh | G11C 29/12005 |
| 2024/0192857 A1* | 6/2024 | Min | G06F 3/0659 |
| 2024/0201864 A1* | 6/2024 | Shin | G06F 3/0655 |
| 2024/0411641 A1* | 12/2024 | Lee | G11C 16/3431 |
| 2025/0173068 A1* | 5/2025 | Shin | G06F 3/0679 |

OTHER PUBLICATIONS

Marotta et al., "Nonvolatile Memory Technologies With Emphasis on Flash", 2008, IEEE Press series on microelectronic systems, 90 pages.

Parial EPO Search Report dated Oct. 17, 2024 from the EPO issued in corresponding EP Patent Application No. 24180457.4.

* cited by examiner

STORAGE DEVICE INCLUDING A READ RECLAIM MODULE AND A RECLAIM OPERATION METHOD THEREOF

CROSS-REFERENCE TO RELATED APPLICATION

This application claims priority under 35 U.S.C. § 119 to Korean Patent Application No. 10-2023-0075157 filed on Jun. 12, 2023, in the Korean Intellectual Property Office, the disclosure of which is incorporated by reference herein in its entirety.

TECHNICAL FIELD

Example embodiments of the present disclosure described herein relate to semiconductor memory devices, and more particularly, to a storage device including a read reclaim module and a reclaim operation method thereof.

DISCUSSION OF RELATED ART

Semiconductor memories can be categorized into two main types: volatile and non-volatile memories. Volatile memories (e.g., a dynamic random access memory (DRAM) or a static random access memory (SRAM)) typically offer faster read and write speeds compared to non-volatile memories. However, the data in volatile memories is lost once power is cut off. In contrast, non-volatile memory preserves data even in the absence of power.

Flash memory is a common form of non-volatile memory that can store multiple bits of data, often two or more, in a single memory cell. The flash memory may have at least one erase state and multiple program (e.g., writing) states, which are determined by threshold voltage distributions.

Flash memory incorporates a read margin between each of its program states to ensure data integrity. However, the threshold voltage of flash memory cells can shift due to various reasons, such as coupling noise, pass voltage disturbance, program voltage disturbance, or read pass voltage disturbance. These changes can cause the threshold voltage of memory cells to increase, leading to an overlap between a first program state and a second program state.

During a read operation in flash memory, a select read voltage may be provided to a selected word line and a high-voltage read pass voltage may be provided to unselected word lines. If the high-voltage read pass voltage is applied repeatedly to the unselected word lines, it can stress the memory cells, leading to an increase in their threshold voltage. As a result, a read failure may occur during a read operation.

SUMMARY

Example embodiments of the present disclosure provide a storage device that may selectively perform a block reclaim or word line reclaim operation during a hot spot read operation.

Example embodiments of the present disclosure provide a storage device that may reduce read disturbances caused by read failures and reduce the number of write operations of a flash memory by performing a word line reclaim operation in place of a block reclaim operation.

According to an embodiment of the present disclosure, there is provided a storage device including: a flash memory including a selected word line and an adjacent word line adjacent to the selected word line; and a memory controller configured to provide a select read voltage to the selected word line and a pass voltage to the adjacent word line during a read operation, the pass voltage being higher than the select read voltage, and wherein the memory controller is further configured to determine whether the selected word line is a hot spot read word line based on a deterioration level of the adjacent word line, and perform a word line reclaim operation for the adjacent word line when the selected word line is the hot spot read word line.

According to an embodiment of the present disclosure, there is provided a storage device including: a flash memory including a first word line and a second word line adjacent to the first word line; and a memory controller configured to provide a select read voltage to the first word line and a pass voltage to the second word line during a read operation, the pass voltage being higher than the select read voltage, wherein the memory controller is further configured to determine whether the first word line is a hot spot read word line based on a deterioration level of the second word line, and perform a block reclaim operation or a word line reclaim operation based on whether the first word line is the hot spot read word line or not.

According to an embodiment of the present disclosure, there is provided a reclaim operation method of a storage device including a flash memory, the method including: determining whether a second word line adjacent to a first word line of the flash memory is a deteriorated word line; determining whether the first word line is a hot spot read word line when the second word line is the deteriorated word line; and performing a word line reclaim operation on the second word line when the first word line is the hot spot read word line.

BRIEF DESCRIPTION OF THE DRAWINGS

The above and other features of the present disclosure will become apparent by describing in detail embodiments thereof with reference to the accompanying drawings.

DETAILED DESCRIPTION OF THE EMBODIMENTS

Below, example embodiments of the present disclosure will be described in detail.

Figure 1:
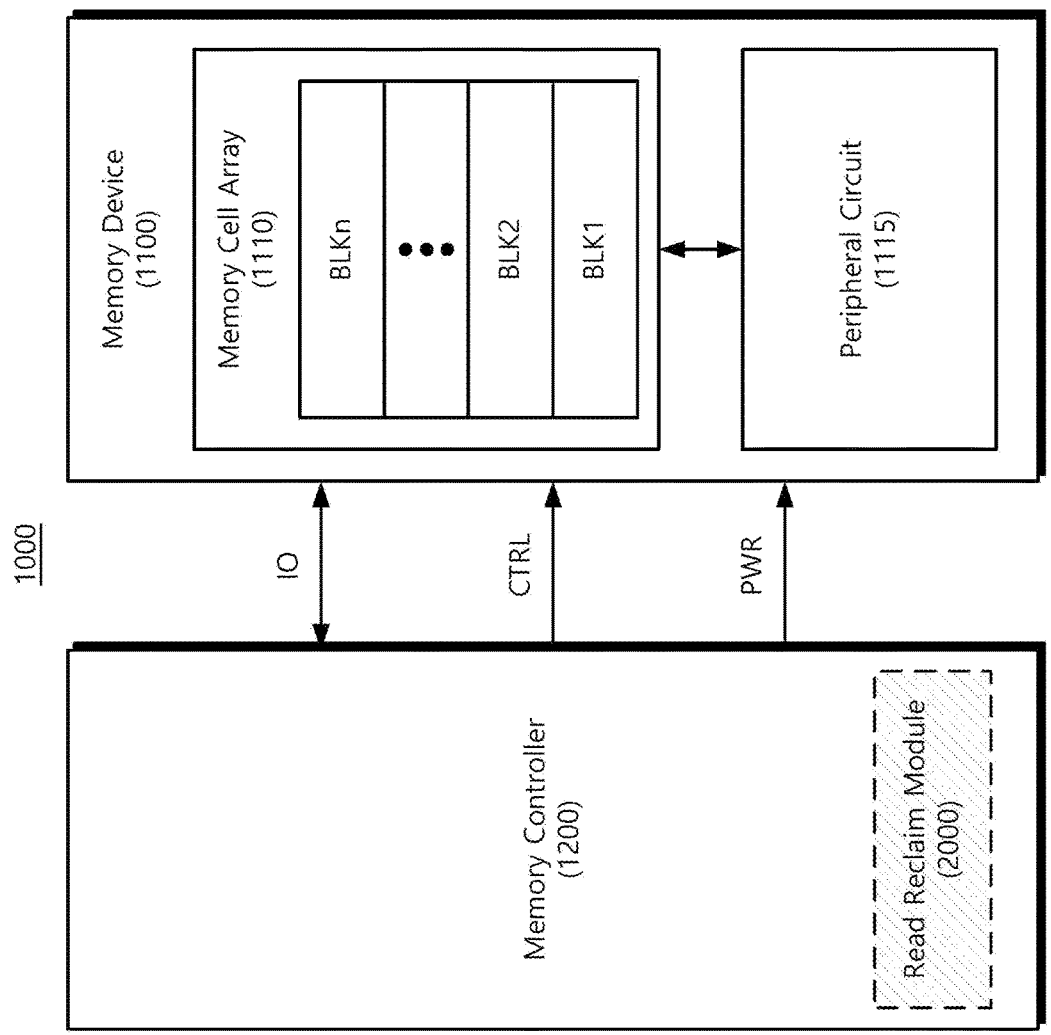
FIG. 1 is a block diagram illustrating a storage device according to an example embodiment of the present disclosure.

FIG. 1 is a block diagram illustrating a storage device according to an example embodiment of the present disclosure. The storage device 1000 may be a flash storage device based on a flash memory. For example, the storage device 1000 may be implemented as a solid-state drive (SSD), a universal flash storage (UFS), a memory card, or the like.

Referring to FIG. 1, the storage device 1000 may include a memory device 1100 and a memory controller 1200. The memory device 1100 may receive input/output signals IO from the memory controller 1200 through input/output lines, receive control signals CTRL through control lines, and receive external power PWR through power lines. The storage device 1000 may store data in the memory device 1100 under the control of the memory controller 1200.

The memory device 1100 may include a memory cell array 1110 and a peripheral circuit 1115. The memory cell array 1110 may include a plurality of memory blocks BLK1 to BLKn. Each memory block may have a vertical three-dimensional (3D) structure. Each memory block may include a plurality of memory cells. Multi-bit data may be stored in each memory cell. For example, more than one bit, typically two or three bits, can be stored in a single memory cell by assigning multiple voltage levels to represent different data states.

The memory cell array 1110 may be located (e.g., disposed) next to or above the peripheral circuit 1115 in terms of the design layout structure. A structure in which the memory cell array 1110 is positioned over the peripheral circuit 1115 may be referred to as a cell on peripheral (COP) structure.

In an example embodiment, the memory cell array 1110 may be manufactured as a chip separate from the peripheral circuit 1115. An upper chip including the memory cell array 1110 and a lower chip including the peripheral circuit 1115 may then be connected to each other by a bonding method. Such a structure may be referred to as a chip-to-chip (C2C) structure.

The peripheral circuit 1115 may include analog circuits and/or digital circuits required to store data in the memory cell array 1110 or read data stored in the memory cell array 1110. The peripheral circuit 1115 may receive the external power PWR through power lines and generate internal powers of various levels.

The peripheral circuit 1115 may receive commands, addresses, and/or data from the memory controller 1200 through input/output lines. The peripheral circuit 1115 may store data in the memory cell array 1110 according to the control signals CTRL. Alternatively or additionally, the peripheral circuit 1115 may read data stored in the memory cell array 1110 and provide the read data to the memory controller 1200.

The memory controller 1200 may include a read reclaim module 2000. The read reclaim module 2000 may be implemented in hardware as a circuit. Additionally, the memory controller 1200 may also be implemented in hardware as a circuit. If one memory block is repeatedly read, error bits may increase due to phenomena such as read disturbance. The operation of moving data stored in a memory block to another memory block before an uncorrectable error occurs in the data stored in the memory block is referred to as a read reclaim operation.

Figure 2:
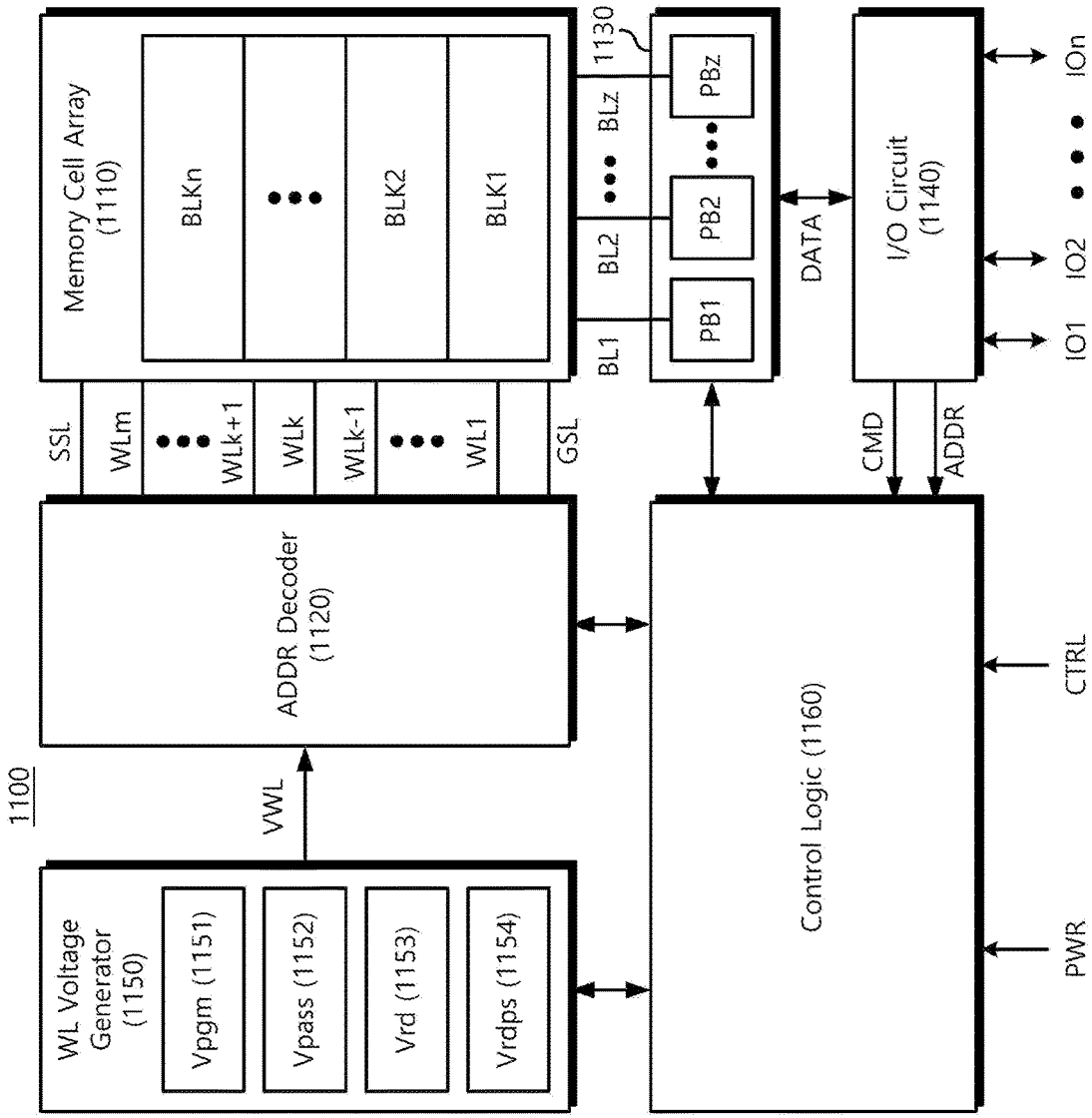
FIG. 2 is a block diagram illustrating the memory device shown in FIG. 1.

FIG. 2 is a block diagram illustrating an example embodiment of the memory device illustrated in FIG. 1. Referring to 2, the memory device 1100 may include the memory cell array 1110 and the peripheral circuit 1115 (see FIG. 1). The peripheral circuit 1115 may include an address decoder 1120, a page buffer circuit 1130, a data input/output circuit 1140, a word line voltage generator 1150, and a control logic 1160. Each of the address decoder 1120, the word line voltage generator 1150, and the control logic 1160 may be implemented in hardware as a circuit.

The memory cell array 1110 may include a plurality of memory blocks BLK1 to BLKn. Each memory block may be composed of a plurality of pages. Each page may include a plurality of memory cells. Each memory cell may store multi-bit data (e.g., two or more bits). Each memory block may correspond to an erase unit, and each page may correspond to a read and/or write unit.

The memory cell array 1110 may be formed in a direction perpendicular to a substrate. A gate electrode layer and an insulation layer may be alternately deposited on the substrate. Each memory block (e.g., BLK1) may be connected to one or more string selection lines SSL, a plurality of word lines WL1 to WLm, and one or more ground selection lines GSL. When WLk is a selected word line sWL, the remaining word lines (WL1 to WLk−1, WLk+1 to WLm) are unselected word lines uWL.

The address decoder 1120 may be connected to the memory cell array 1110 through the string selection lines SSL and the ground selection lines GSL and the word lines WL1 to WLm. The address decoder 1120 may select a word line during a program or read operation. The address decoder 1120 may receive a word line voltage VWL from the word line voltage generator 1150 and provide a program voltage or read voltage to the selected word line.

The page buffer circuit 1130 may be connected to the memory cell array 1110 through bit lines BL1 to BLz. The page buffer circuit 1130 may temporarily store data to be stored in the memory cell array 1110 or data read from the memory cell array 1110. The page buffer circuit 1130 may include page buffers PB1 to PBz connected to respective bit lines. Each page buffer may include a plurality of latches to store or read multi-bit data.

The input/output circuit 1140 may be internally connected to the page buffer circuit 1130 through data lines and externally connected to the memory controller (refer to FIG. 1, 1200) through input/output lines IO1 to IOn. The input/output circuit 1140 may receive program data from the memory controller 1200 during a program operation. Additionally, the input/output circuit 1140 may provide data read from the memory cell array 1110 to the memory controller 1200 during a read operation.

The word line voltage generator 1150 may receive internal power from the control logic 1160 and generate a word line voltage VWL required to read or write data. The word line voltage VWL may be provided to a selected word line (sWL) or unselected word lines (uWL) through the address decoder 1120.

The word line voltage generator 1150 may include a program voltage generator 1151 and a pass voltage generator 1152. The program voltage generator 1151 may generate a program voltage Vpgm provided to the selected word line sWL during a program operation. The pass voltage generator 1152 may generate a pass voltage Vpass provided to the selected word line sWL and the unselected word lines uWL.

The word line voltage generator 1150 may include a read voltage generator 1153 and a read pass voltage generator 1154. The read voltage generator 1153 may generate a select read voltage Vrd provided to the selected word line sWL during a read operation. The read pass voltage generator 1154 may generate a read pass voltage Vrdps provided to unselected word lines uWL. The read pass voltage Vrdps may be a voltage sufficient to turn on memory cells connected to the unselected word lines uWL during a read operation.

The control logic 1160 may control operations such as read, write, and erase of the memory device 1100 using commands CMD, addresses ADDR, and control signals CTRL provided from the memory controller 1200. The addresses ADDR may include a block selection address for selecting one memory block, a row address for selecting one page, and a column address for selecting one memory cell.

Figure 3:
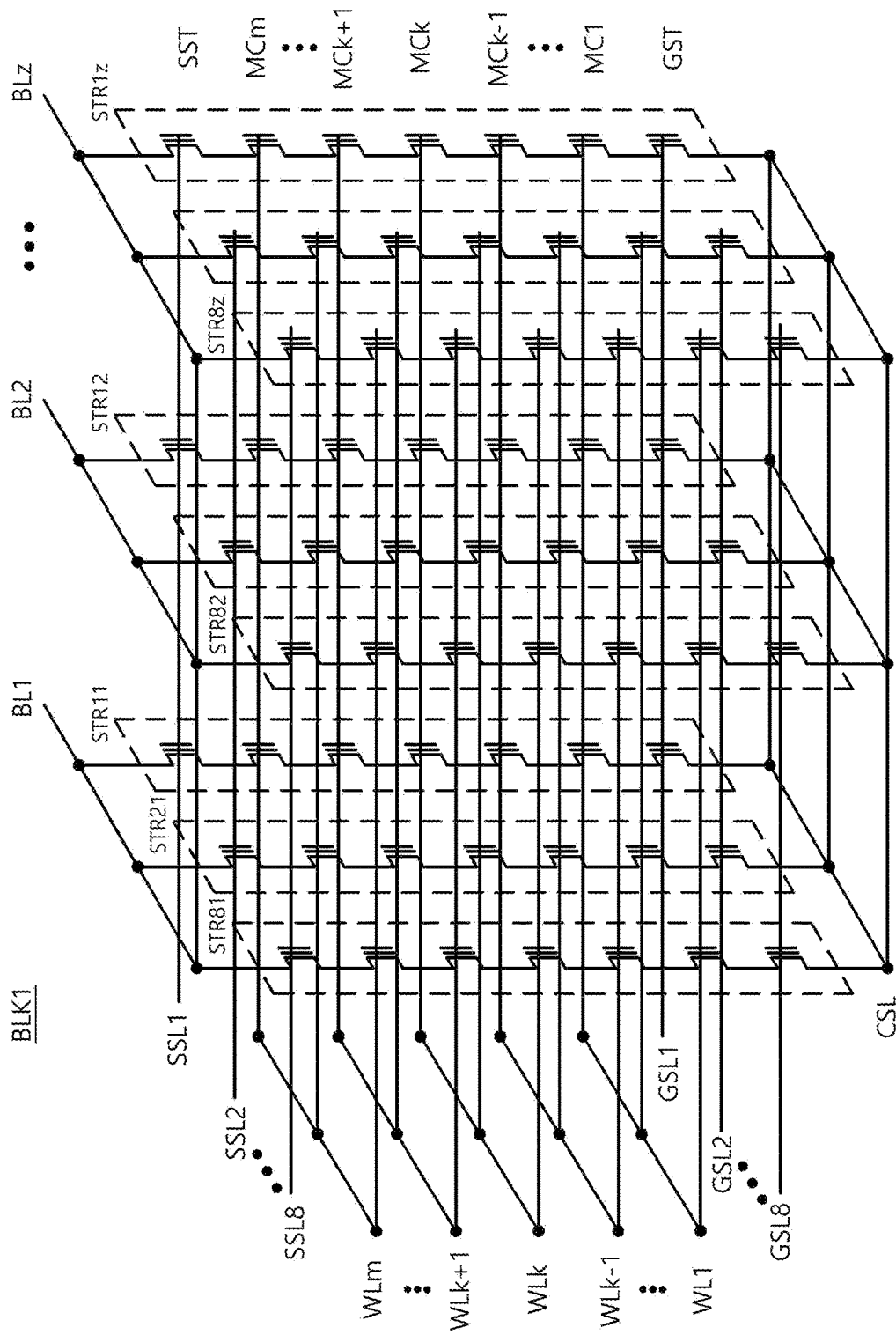
FIG. 3 is a circuit diagram illustrating an example embodiment of a memory block of the memory cell array illustrated in FIG. 2.

FIG. 3 is a circuit diagram illustrating an example embodiment of a memory block BLK1 of the memory cell array illustrated in FIG. 2. Referring to FIG. 3, in the memory block BLK1, a plurality of cell strings STR11 to STR8z may be formed between the bit lines BL1 to BLz and a common source line CSL. Each cell string includes a string selection transistor SST, a plurality of memory cells MC1 to MCm, and a ground selection transistor GST.

The string selection transistors SST may be connected with string selection lines SSL1 to SSL8. The ground selection transistors GST may be connected with ground selection lines GSL1 to GSL8. The string selection transistors SST may be connected with the bit lines BL1 to BLz, and the ground selection transistors GST may be connected with the common source line CSL.

The first to m-th word lines WL1 to WLm may be connected with the plurality of memory cells MC1 to MCm in a row direction. The first to z-th bit lines BL1 to BLz may be connected with the plurality of memory cells MC1 to MCm in a column direction. First to z-th page buffers PB1 to PBz may be connected with the first to z-th bit lines BL1 to BLz.

The first word line WL1 may be placed above the first to eighth ground selection lines GSL1 to GSL8. The first memory cells MC1 that are placed at the same height from the substrate may be connected with the first word line WL1. The second word line WL2 may be placed above the first word line WL1. The second memory cells MC2 that are placed at the same height from the substrate may be connected with the second word line WL2. In a similar manner, the third to m-th memory cells MC3 to MCm that are placed at the same heights from the substrate may be respectively connected with the third to m-th word lines WL3 to WLm.

Figure 4:
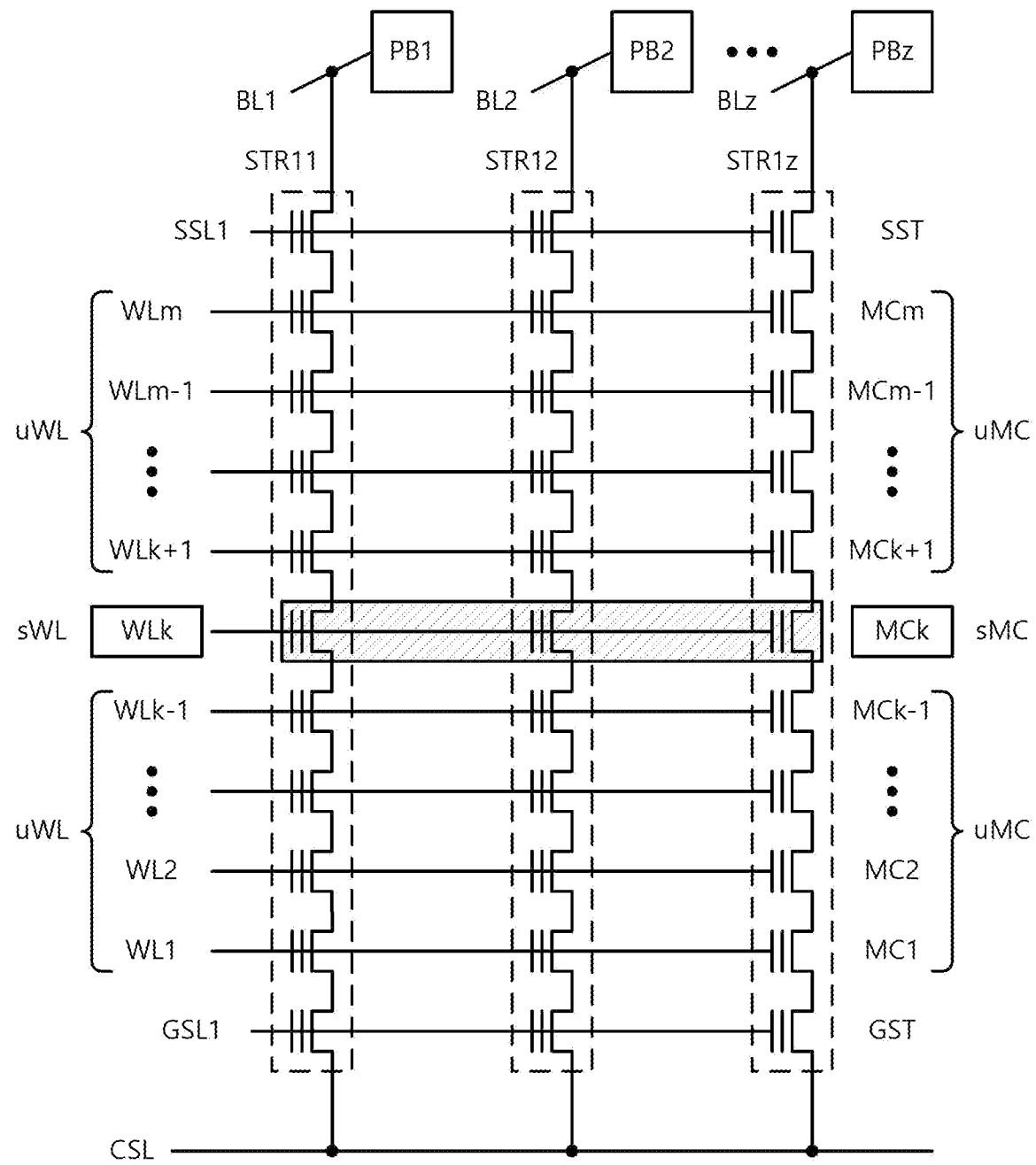
FIG. 4 is a circuit diagram illustrating cell strings selected by the first string selection line from among the cell strings of the memory block illustrated in FIG. 3.

FIG. 4 is a circuit diagram illustrating cell strings selected by the first string selection line SSL1 from among the cell strings of the memory block BLK1 illustrated in FIG. 3. The eleventh to 1z cell strings STR11 to STR1z may be selected by the first string selection line SSL1. The eleventh to 1z cell strings STR11 to STR1z may be connected to the first to z-th bit lines BL1 to BLz, respectively. The first to z-th page buffers PB1 to PBz may be connected to the first to z-th bit lines BL1 to BLz, respectively.

The eleventh cell string STR11 may be connected to the first bit line BL1 and the common source line CSL. The eleventh cell string STR11 may include string selection transistors SST selected by the first string selection line SSL1, first to m-th memory cells MC1 to MCm connected to the first to m-th word lines WL1 to WLm, and ground selection transistors GST selected by the first ground selection line GSL1. The twelfth cell string STR12 may be connected to the second bit line BL2 and the common source line CSL. The 1z cell string STR1z may be connected to the z-th bit line BLz and the common source line CSL.

The first word line WL1 and the m-th word line WLm may be edge word lines (edge WL). For example, the first word line WL1 may be a bottom edge word line and the m-th word line WLm may be a top edge word line. The second word line WL2 and the (m−1)-th word line WLm−1 may be edge adjacent word lines. The k-th word line WLk may be a selected word line sWL. The (k−1)-th word line WLk−1 and the (k+1)-th word line WLk+1 may be adjacent word lines adjacent to the selected word line. If the k-th word line WLk is the selected word line sWL, the remaining word lines WL1 to WLk−1 and WLk+1 to WLm may be unselected word lines uWL.

The first memory cells MC1 and the m-th memory cells MCm may be edge memory cells. The second memory cells MC2 and the (m−1)-th memory cells MCm−1 may be edge adjacent memory cells. The k-th memory cells MCK may be selected memory cells sMC. The (k−1)-th memory cells MCk−1 and the (k+1)-th memory cells MCk+1 may be memory cells adjacent to the selected memory cells sMC (adjacent MC). If the k-th memory cells MCK are selected memory cells sMC, the remaining memory cells MC1 to MCk−1 and MCk+1 to MCm may be unselected memory cells uMC.

A set of memory cells selected by one string selection line and connected to one word line may be one page. For example, memory cells selected by the first string selection line SSL1 and connected to the k-th word line WLk may be one page. For example, eight pages may be configured on the k-th word line WLk. Among the eight pages, a page connected to the first string selection line SSL1 is a selected page, and pages connected to the second to eighth string selection lines SSL2 to SSL8 are unselected pages.

Figure 5:
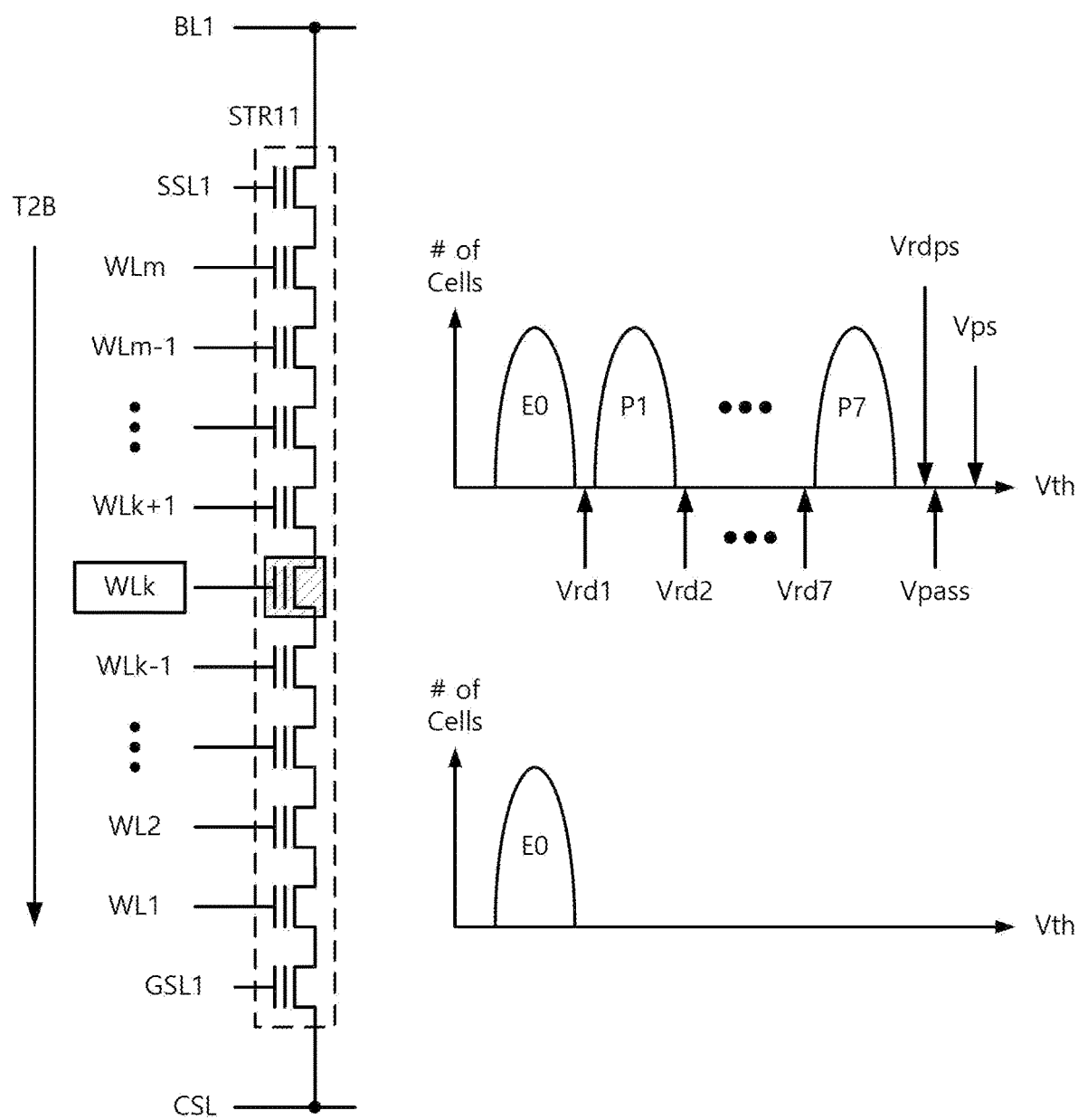
FIG. 5 is a diagram illustrating an example embodiment of threshold voltage distributions of memory cells illustrated in FIG. 4.

FIG. 5 is a diagram illustrating an example embodiment of threshold voltage distributions of memory cells illustrated in FIG. 4. The horizontal axis represents the threshold voltage Vth, and the vertical axis represents the number of memory cells. FIG. 5 shows an example in which 3-bit data is stored in one memory cell. A 3-bit memory cell may have one of eight states (E0, P1 to P7) according to the threshold voltage distribution. E0 represents an erase state, and P1 to P7 represent program states.

During a read operation, the selection read voltages Vrd1 to Vrd7 may be provided to the selected word line sWL, and the pass voltage Vps and/or the read pass voltage Vrdps may be provided to the unselected word lines uWL. The pass voltage Vps and/or the read pass voltage Vrdps may be a voltage sufficient to turn on the memory cells. For example, the pass voltage Vps may be provided to the adjacent word lines WLk+1, and the read pass voltage Vrdps may be provided to the unselected word lines other than the adjacent word lines. For example, the read pass voltage Vrdps may be provided to the unselected word lines WLk+2 to WLm.

The first selection read voltage Vrd1 may be a voltage level between the erase state E0 and the first program state P1. The second selection read voltage Vrd2 may be a voltage level between the first and second program states P1 and P2. In this way, the seventh selection read voltage Vrd7 may be a voltage level between the sixth and seventh program states P6 and P7.

When the first selection read voltage Vrd1 is applied, the memory cell in the erase state E0 may be an on cell and the memory cell in the first to seventh program states P1 to P7 may be an off cell. When the second selection read voltage Vrd2 is applied, the memory cell in the erase state E0 and the first program state P1 may an on cell, and the memory cell in the second to seventh program states P2 to P7 may an off cell. In this way, when the seventh selection read voltage Vrd7 is applied, the memory cell in the erase state E0 and the first to sixth program states P1 to P6 may be an on cell and the memory cell in the seventh program state P7 may be an off cell.

During a read operation, the k-th word line WLk may be selected. A power supply voltage may be applied to the string selection line SSL1 and the ground selection line GSL1, and the string select transistor SST and the ground select transistor GST may be turned on. Additionally, the selection read voltage Vrd may be provided to the selected word line sWL, and the read pass voltage Vrdps and/or the pass voltage Vps may be provided to the unselected word lines uWL.

When the read operation of the k-th word line WLk is repeatedly performed, the high voltage read pass voltage Vrdps may be repeatedly provided to the remaining word lines. In this case, a read disturbance may occur in the remaining word lines, leading to a distortion in their threshold voltages. Memory cells connected to the k-th word line WLk may be off cells when a selection read voltage Vrd is provided. In other words, when the threshold voltage of the k-th memory cell is higher than the selection read voltage Vrd, the k-th memory cell may be an off cell. When the k-th memory cell is an off cell, a channel may be separated at the k-th memory cell. In other words, a lower channel of the k-th memory cell may receive a ground voltage from the common source line CSL, and an upper channel of the k-th memory cell may have a negative channel voltage Vneg.

A channel voltage difference may occur between a lower channel and an upper channel with the k-th memory cell interposed therebetween. The presence of a voltage difference across the channel can result in hot carrier injection (HCI) in adjacent memory cells MCk±1. For this reason, threshold voltages of memory cells connected to adjacent word lines WLk±1 may be distorted. For example, the threshold voltages of memory cells in the erased state E0 may rise to enter the programmed state, e.g., P1.

Figure 6:
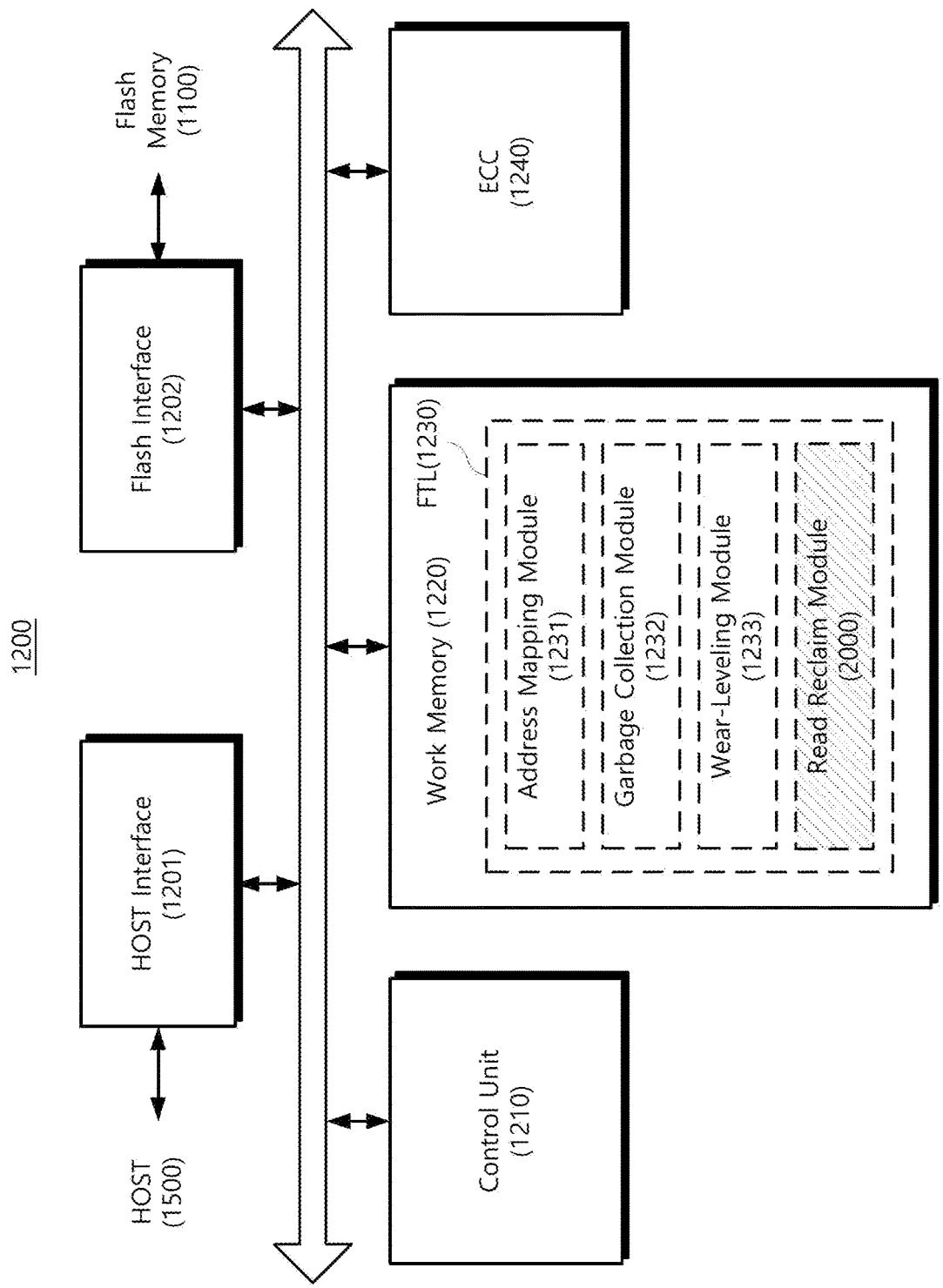
FIG. 6 is a block diagram illustrating an example embodiment of the memory controller in FIG. 1.

FIG. 6 is a block diagram illustrating an example embodiment of the memory controller in FIG. 1. Referring to FIG. 6, the memory controller 1200 may include a host interface 1201, a flash interface 1202, a control unit 1210, a work memory 1220, and an error correction code (ECC) circuit 1240. The work memory 1220 may drive a flash translation layer (FTL) 1230. Each component of the memory controller 1200 may be implemented in hardware as a circuit.

The memory controller 1200 may further include various components. For example, the memory controller 1200 may include a buffer memory that temporarily stores data resulting from a read or write operation of the flash memory 1100. The memory controller 1200 may further include a buffer control module for controlling the buffer memory, or a command generation module for generating a command (CMD) for controlling a memory operation according to a request from a host 1500, etc.

The host interface 1201 may provide an interface between the host 1500 and the memory controller 1200. The host interface 1201 may include various interface methods such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), secure digital card (SD), multi-media card (MMC), embedded multi-media card (eMMC), universal flash storage (UFS), compact flash (CF), etc.

The flash interface 1202 may provide an interface between the flash memory 1100 and the memory controller 1200. For example, write or read data may be transmitted to and received from the flash memory 1100 through the flash interface 1202. The flash interface 1202 may provide commands and addresses to the flash memory 1100. The flash interface 1202 may provide data read from the flash memory 1100 to the memory controller 1200.

The control unit 1210 may include a central processing unit or microprocessor, and may control the overall operation of the memory controller 1200. The control unit 1210 may drive firmware loaded in the work memory 1220 to control the memory controller 1200.

The work memory 1220 may be implemented with various types of memory, such as DRAM, SRAM, or phase-change RAM (PRAM). The work memory 1220 may drive the flash translation layer (FTL) 1230 under the control of the control unit 1210.

The flash translation layer 1230 may be loaded from the flash memory 1100 to the work memory 1220 during a boot operation of the storage device 1000. The flash translation layer 1230 may include an address mapping module 1231, a garbage collection module 1232, a wear-leveling module 1233, and/or a read reclaim module 2000, depending on the function implemented by the firmware. The read reclaim module 2000 may be a circuit.

The address mapping module 1231 may perform address mapping operations on a page-by-page or block-by-block basis. The page address mapping operation is an operation that converts a logical page address received from the file system into a physical page address in the flash memory 1100. For this purpose, a page-level address mapping table must be maintained in the work memory 1220. The page address mapping operation may provide excellent garbage collection performance, but require a large address mapping table.

The block address mapping operation is an operation that converts a logical block address received from the file system into a physical block address in the flash memory 1100. Pages belonging to the same logical block may belong to the same physical block. For this purpose, a block-level address mapping table must be maintained in the work memory 1220. Block address mapping operations require a small address mapping table, but additional garbage collection operations may need to be performed.

The flash translation layer 1230 may perform a hybrid mapping operation that combines the advantages of a page address mapping operation and a block address mapping operation. The flash translation layer 1230 may perform a hybrid mapping operation based on the log buffer. The log buffer-based hybrid mapping operation requires a small memory space while providing excellent garbage collection performance.

The garbage collection module 1232 may perform a garbage collection operation by referring to the address mapping table. The garbage collection module 1232 may use an address mapping table to secure one or more free blocks. The garbage collection module 1232 may move one or more valid data stored in a source block to a target block using the address mapping table. The garbage collection module 1232 may make a free block by erasing the source block to which all valid data has been moved.

The wear-leveling module 1233 may manage the wear-level of memory cells of the flash memory 1100. Memory cells may be deteriorated by write and erase operations, etc. Deteriorated memory cells may cause defects. The wear-leveling module 1233 may prevent specific cell areas from wearing out faster than other cell areas by managing program-erase cycles for the memory cell array 1110. The wear-leveling module 1233 may control the address mapping module 1231 so that program-erase times are equally assigned to cell areas of the memory cell array 1110.

The read reclaim module 2000 may perform a read reclaim operation. The read reclaim operation is an operation that moves data stored in a memory block to another memory block before an uncorrectable error occurs in the data stored in the memory block. The read reclaim module 2000 may perform a block reclaim operation and/or a word line reclaim operation.

The read reclaim module 2000 may perform a block reclaim operation on a memory block basis. The block reclaim operation will be explained in more detail in FIG. 7. The read reclaim module 2000 may perform a word line reclaim operation on a word line basis. The word line reclaim operation will be explained in more detail in FIG. 8.

The read reclaim module 2000 may selectively perform a block reclaim operation and a word line reclaim operation. Additionally, the garbage collection module 1232 may perform a block reclaim operation, and the read reclaim module 2000 may perform a word line reclaim operation. The word line reclaim operation may be performed on adjacent word lines that experience read disturbance most severely in the case of a hot spot read pattern.

The ECC circuit 1240 may generate an ECC to correct fail bits or error bits of data received from the flash memory 1100. The ECC circuit 1240 may perform error correction encoding on data provided to the flash memory 1100 to form data to which a parity bit is added. Parity bits may be stored in the flash memory 1100.

The ECC circuit 1240 may perform error correction decoding on data output from the flash memory 1100. The ECC circuit 1240 may correct errors using parity. The ECC circuit 1240 may correct errors using coded modulation, such as low density parity check (LDPC) code, Bose, Chaudhuri, and Hocquenghem (BCH) code, turbo code, Reed-Solomon code, convolution code, recursive systematic code (RSC), trellis-coded modulation (TCM), and block coded modulation (BCM).

The ECC circuit 1240 may have an error correction allowable range. For example, the ECC circuit 1240 may correct errors of up to 40 bits for 2K bytes of page data. In this case, the maximum allowable range in which the ECC circuit 1240 may correct errors is 40 bits. In other words, the ECC circuit 1240 may not correct errors in the page if errors in more than 40 bits occur. A page whose errors cannot be corrected is called a defected page. A memory cell in which an error occurs in a defective page is called a defected cell.

During a read operation, the flash memory 1100 may provide a select read voltage Vrd to the selected word line sWL and a pass voltage Vps or a read pass voltage Vrdps to the unselected word lines uWL. The pass voltage Vps may be provided to the adjacent word lines WLk±1. The read pass voltage Vrdps may be provided to the remaining unselected word lines uWL. As shown in FIG. 5, the pass voltage Vps may be higher than the read pass voltage Vrdps.

With a hot spot read pattern, a read operation on a selected word line (e.g., WLk) may be performed repeatedly. When a read operation for WLk is repeatedly performed, select read voltages (see FIG. 5, Vrd1, Vrd2, . . . , Vrd7) may be provided to WLk, and a pass voltage Vps may be applied to WLk+1. A read pass voltage Vrdps may be applied to the remaining unselected word lines uWL. When a hot spot read operation is performed, memory cells connected to the adjacent word lines WLk+1 may rapidly deteriorate.

Figure 7:
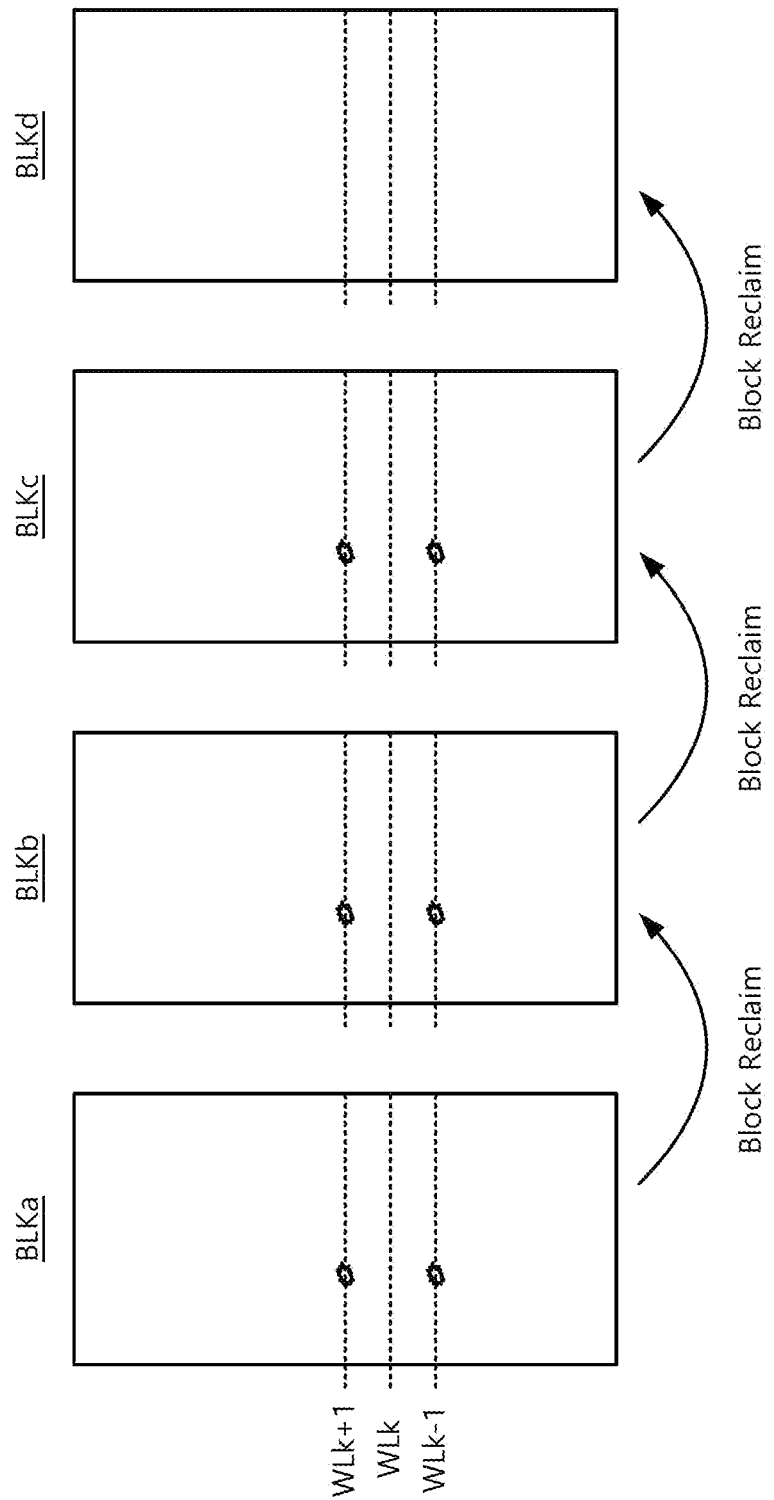
FIG. 7 is a diagram illustrating a block reclaim operation method of the read reclaim module shown in FIG. 6.

FIG. 7 is a diagram illustrating a block reclaim operation method of the read reclaim module shown in FIG. 6. The flash memory 1100 may perform a block reclaim operation under the control of the read reclaim module 2000.

Referring to FIG. 7, the flash memory 1100 may include memory blocks BLKa to BLKd. A hot spot read operation may be performed in the a-th memory block BLKa. Due to the hot spot read operation on the selected word line WLk, a read disturbance may occur in the adjacent word lines WLk±1. The read reclaim module 2000 may check the deterioration state of memory cells in the adjacent word lines WLk±1 and perform the block reclaim operation to prevent a read failure due to the read disturbance.

If the read reclaim module 2000 determines that the memory cells connected to the adjacent word lines WLk±1 of the a-th memory block BLKa are deteriorated, the read reclaim module 2000 may move the data of the memory cells connected to the adjacent word lines WLk±1 to the b-th memory block BLKb through a block reclaim operation. Due to a hot spot read operation for the selected word line WLk in the b-th memory block BLKb, the read disturbance may occur again in the adjacent word lines WLk±1. The read reclaim module 2000 may perform a block reclaim operation on the c-th memory block BLKc to prevent a read fail. When deterioration occurs in the c-th memory block BLKc, the read reclaim module 2000 may move the data of the memory cells connected to the adjacent word lines WLk±1 to the d-th memory block BLKd through a block reclaim operation.

The read reclaim module 2000 may prevent read failure due to a read disturbance through a block reclaim operation without distinguishing host read patterns. The read reclaim module 2000 may perform a block reclaim operation when a specific read count is reached. For example, when a read operation on the selected word line WLk of the a-th memory block BLKa is performed 1,000 times, the read reclaim module 2000 may perform a block reclaim operation on the b-th memory block BLKb.

Figure 8:
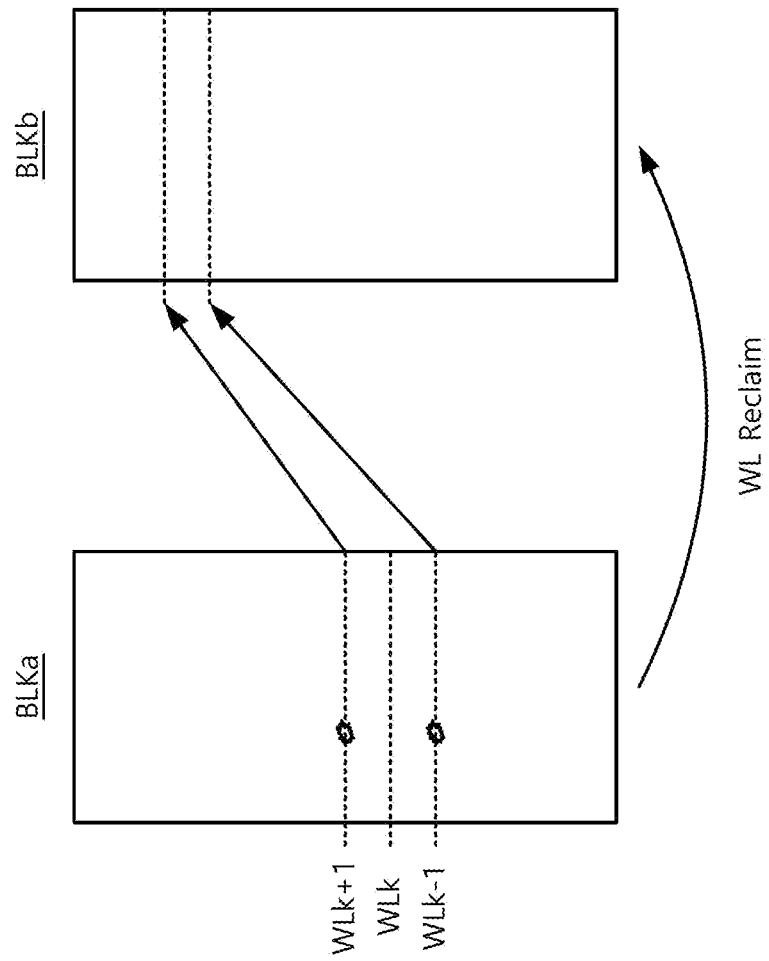
FIG. 8 is a diagram illustrating a word line reclaim operation method of the read reclaim module shown in FIG. 6.

FIG. 8 is a diagram illustrating a word line reclaim operation method of the read reclaim module shown in FIG. 6. The read reclaim module 2000 may distinguish a hot spot read pattern and perform a word line reclaim operation under the control of the read reclaim module 2000.

Referring to FIG. 8, the flash memory 1100 may include memory blocks BLKa and BLKb. The read reclaim module 2000 may perform a reclaim operation only for a specific word line through a hot spot read pattern. For example, the read reclaim module 2000 may perform a word line reclaim operation only for adjacent word lines WLk±1.

If a read operation for the selected word line WLk is repeatedly performed through a hot spot read pattern, deterioration due to a read disturbance may progress faster at the adjacent word lines WLk±1 than at the selected word line WLk. When the deterioration of memory cells connected to the adjacent word lines WLk±1 progresses sufficiently, the number of error bits of memory cells connected to the selected word line WLk may be low.

However, in cases other than the hot spot read pattern, even if the read operation is repeated, the level of deterioration of memory cells due to a read disturbance of the selected word line WLk and the adjacent word lines WLk±1 may be similar. In other words, when the memory cells connected to the adjacent word lines WLk±1 progresses sufficiently, the number of error bits in the selected word line WLk may be relatively higher than in the case of a hot spot read pattern.

The read reclaim module 2000 may determine a hot spot read pattern based on the deterioration level of the selected word line WLk and perform a word line reclaim operation for the adjacent word lines WLk+1. The read reclaim module 2000 may move data stored in the adjacent word lines WLk+1 of the a-th memory block BLKa to the b-th memory block BLKb. The read reclaim module 2000 may reduce a Write Amplification Factor (WAF) and increase a Quality of Service (QOS) by performing a reclaim operation only on the deteriorated adjacent word lines WLk+1.

Figure 9:
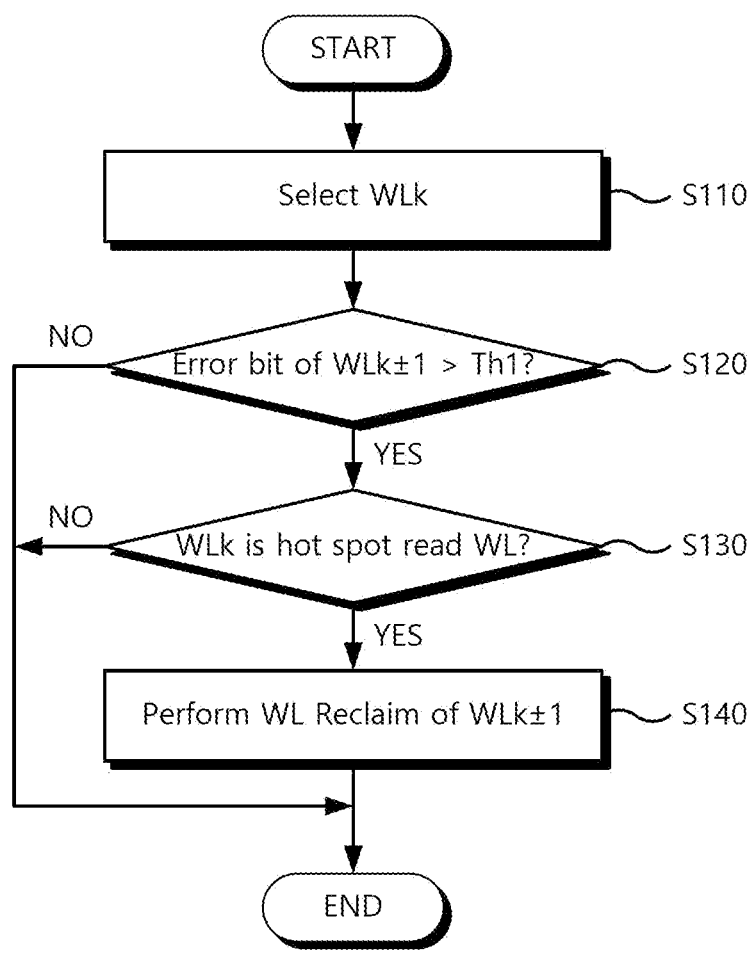
FIG. 9 is a flowchart for explaining the operation method of the read reclaim module shown in FIG. 6.

FIG. 9 is a flowchart for explaining the operation method of the read reclaim module shown in FIG. 6. The read reclaim module 2000 may perform a block reclaim operation and/or a word line reclaim operation. FIG. 9 shows an operation in which the read reclaim module 2000 performs a word line reclaim using the number of error bits of adjacent word lines.

In operation S110, the read reclaim module 2000 may select WLk. WLk may be a selected word line that repeatedly performs a read operation through a hot spot read pattern. When a read operation is performed through a hot spot read pattern, a select read voltage Vrd may be repeatedly provided to WLk. Since the select read voltage Vrd is relatively lower than the pass voltage Vps or read pass voltage Vrdps, memory cells connected to WLk may have a relatively low degree of deterioration.

In operation S120, the read reclaim module 2000 may determine the level of degradation of WLk+1. WLk+1 may be adjacent word lines immediately adjacent to the selected word line WLk that repeatedly performs a read operation through a hot spot read pattern. The read reclaim module 2000 may determine the level of deterioration of WLk+1 based on whether the number of error bits of memory cells connected to WLk+1 is greater than a first threshold Th1.

The number of error bits in memory cells connected to WLk+1 may be determined several ways. For example, the read reclaim module 2000 may determine the number of error bits of WLk+1 using the ECC circuit 1240 in the memory controller 1200. Alternatively, the read reclaim module 2000 may determine the number of error bits using the pass/fail check logic within the flash memory 1100.

The read reclaim module 2000 may not perform the word line reclaim operation if the number of error bits of WLk+1 is not greater than the first threshold Th1 (NO). If the number of error bits of WLk+1 is greater than the first threshold Th1 (YES), the read reclaim module 2000 may perform operation S130.

In operation S130, the read reclaim module 2000 may determine whether the selected word line WLk is a hot spot read word line. The read reclaim module 2000 may not perform a word line reclaim operation if the selected word line WLk is not the hot spot read word line (NO). The read reclaim module 2000 may perform operation S140 if the selected word line WLk is the hot spot read word line (YES).

When a user repeatedly reads data from a specific file, the host may request a hot spot read from the storage device 1000. The read reclaim module 2000 may receive a read request from the host and determine whether the selected word line WLk is a hot spot read word line.

In operation S140, the read reclaim module 2000 may perform a word line reclaim operation for the adjacent word lines WLk+1. If a read operation for the selected word line WLk is repeatedly performed through a hot spot read pattern, deterioration due to a read disturbance at the adjacent word lines WLk+1 may progress rapidly.

The read reclaim module 2000 may determine a hot spot read pattern based on the deterioration level of the selected word line WLk and perform a word line reclaim operation for the adjacent word lines WLk+1. The read reclaim module 2000 may reduce the WAF and increase the QoS by performing a reclaim operation only for the deteriorated adjacent word lines WLk+1.

Figure 10:
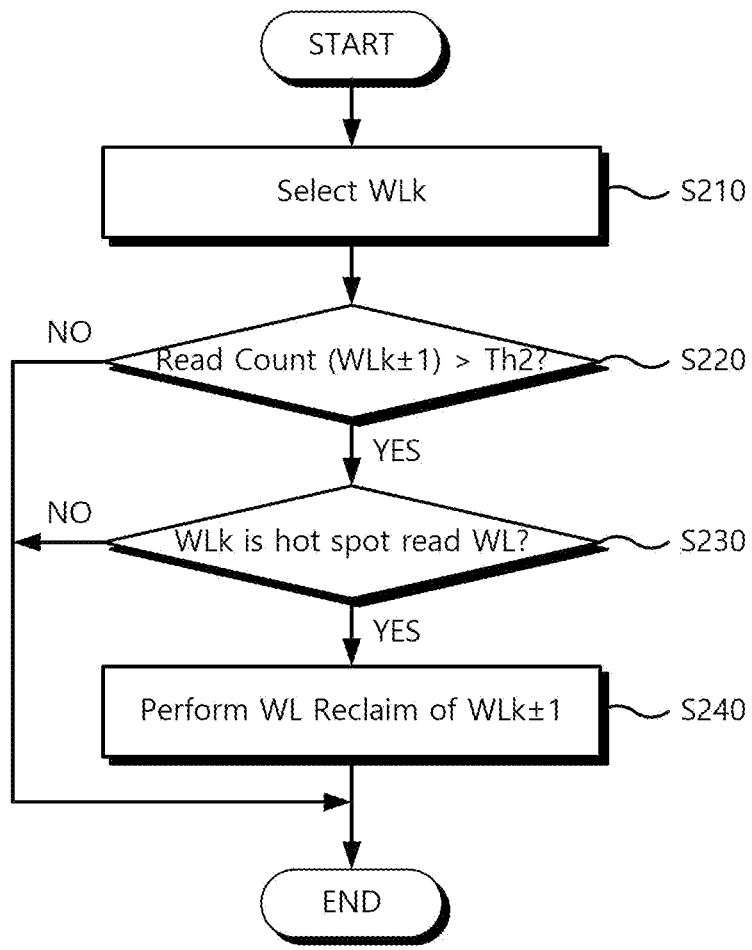
FIG. 10 is a flowchart illustrating a word line reclaim operation of the read reclaim module shown in FIG. 6.

FIG. 10 is a flowchart illustrating a word line reclaim operation of the read reclaim module shown in FIG. 6. The read reclaim module 2000 may perform the word line reclaim operation using the read count of adjacent word lines.

In operation S210, the read reclaim module 2000 may select WLk. WLk may be a selected word line that repeatedly performs a read operation through a hot spot read pattern.

In operation S220, the read reclaim module 2000 may determine whether the read count of adjacent word lines WLk+1 is greater than the second threshold Th2. The read reclaim module 2000 may not perform a word line reclaim operation if the read count of the adjacent word lines WLk+1 is not greater than the second threshold Th2 (NO). The read reclaim module 2000 may perform operation S230 if the read count of the adjacent word lines WLk+1 is greater than the threshold Th2 (YES).

The read count of memory cells connected to the adjacent word lines WLk+1 may be determined in several ways. For example, the read reclaim module 2000 may receive a read count of the adjacent word lines WLk+1 from the host 1500. The read reclaim module 2000 may calculate the read count using a read count circuit within the memory controller 1200. Alternatively, the read reclaim module 2000 may determine the read count using a read count circuit in the flash memory 1100.

In operation S230, the read reclaim module 2000 may determine whether the selected word line WLk is a hot spot read word line. The read reclaim module 2000 may receive a read request from the host and determine whether the selected word line WLk is a hot spot read word line. The read reclaim module 2000 may not perform a word line reclaim operation if the selected word line WLk is not a hot spot read word line (NO). The read reclaim module 2000 may perform a word line reclaim operation (i.e., operation S240) if the selected word line WLk is a hot spot read word line (YES).

In operation S240, the read reclaim module 2000 may perform a word line reclaim operation for the adjacent word lines WLk+1. If a read operation for the selected word line WLk is repeatedly performed through a hot spot read pattern, deterioration due to a read disturbance at the adjacent word lines WLk+1 may progress rapidly.

The read reclaim module 2000 may determine a hot spot read pattern based on the deterioration level of the selected word line WLk and perform a word line reclaim operation for the adjacent word lines WLk+1. The read reclaim module 2000 may reduce the WAF and increase the QoS by performing a reclaim operation only for the deteriorated the adjacent word lines WLk+1.

Figure 11:
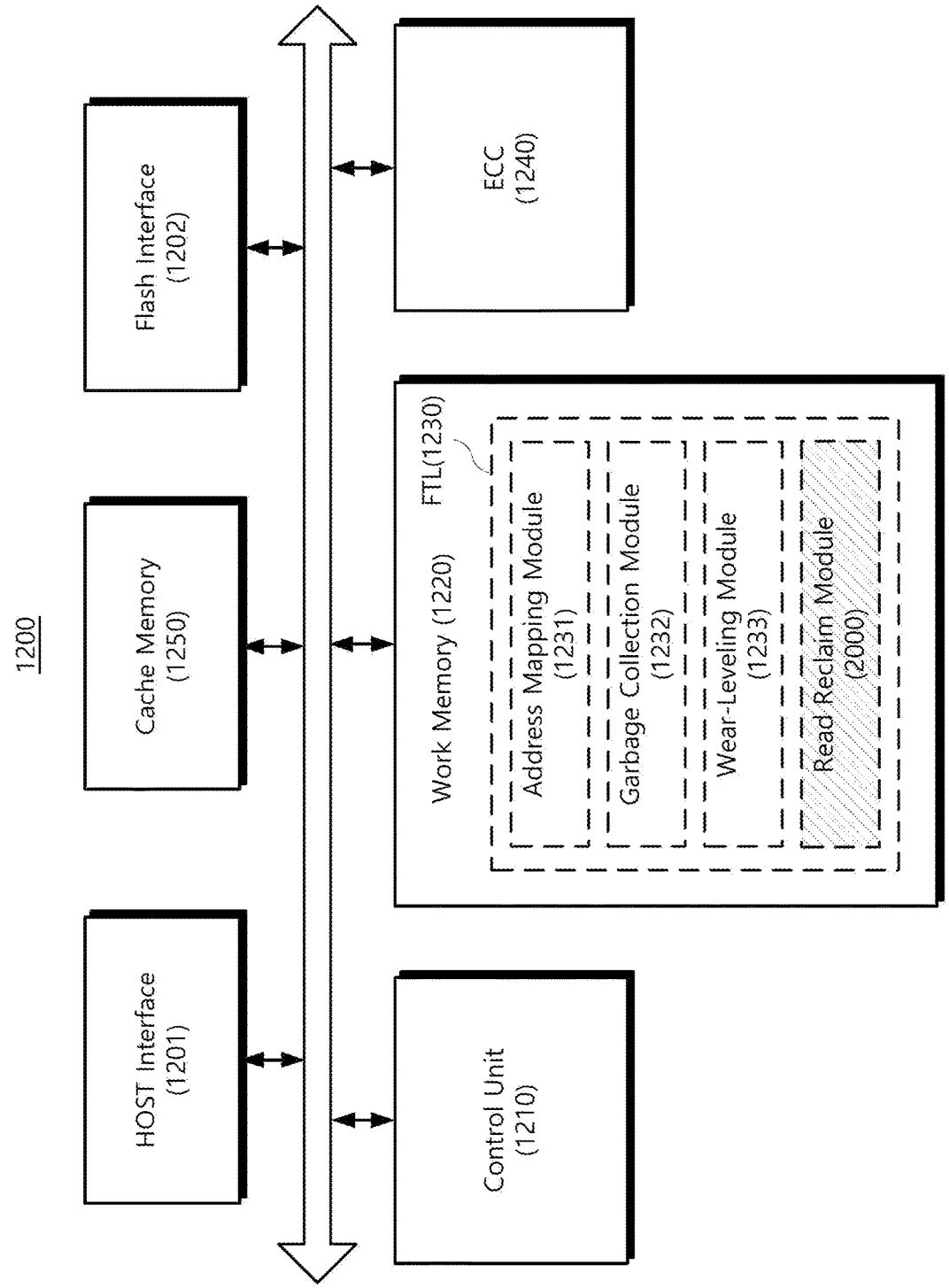
FIG. 11 is a block diagram illustrating a memory controller that performs a read reclaim operation using cache memory.

FIG. 11 is a block diagram illustrating a memory controller that performs a read reclaim operation using cache memory. Referring to FIG. 11, the memory controller 1200 may include a host interface 1201, a flash interface 1202, a control unit 1210, a work memory 1220, an ECC circuit 1240, and a cache memory 1250. The work memory 1220 may drive a flash translation layer (FTL) 1230.

The flash translation layer 1230 may include an address mapping module 1231, a garbage collection module 1232, a wear-leveling module 1233, and a read reclaim module 2000. The read reclaim module 2000 may perform a read reclaim operation. The read reclaim operation is an operation that moves data stored in a memory block to another memory block before an uncorrectable error occurs in the data stored in the memory block.

The read reclaim module 2000 may perform a block reclaim operation and/or a word line reclaim operation. The read reclaim module 2000 may selectively perform a block reclaim operation and a word line reclaim operation. Additionally, the garbage collection module 1232 may perform a block reclaim operation, and the read reclaim module 2000 may perform a word line reclaim operation. The word line reclaim operation may be performed on adjacent word lines that experience the most severe read disturbance in the case of a hot spot read pattern.

The cache memory 1250 may be implemented with various types of memory, such as DRAM, SRAM, or PRAM. The read reclaim module 2000 may perform a word line reclaim operation for the adjacent word lines WLk+1 during a hot spot read operation and store data of memory cells connected to the selected word line WLk in the cache memory 1250. The cache memory 1250 may store data of the selected word line WLk that is repeatedly read during a hot spot read operation. The memory controller 1200 may increase read speed and effectively reduce read disturbance of unselected word lines uWL.

Figure 12:
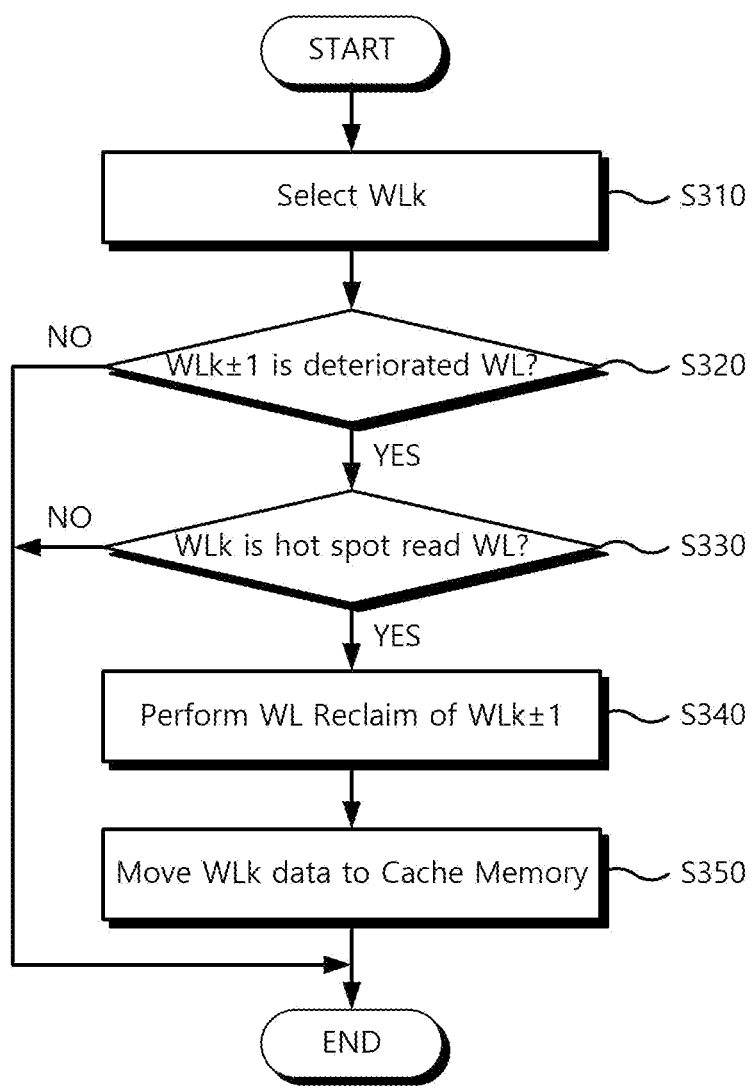
FIG. 12 is a flowchart for explaining an word line reclaim operation of the read reclaim module shown in FIG. 11.

FIG. 12 is a flowchart for explaining an word line reclaim operation of the read reclaim module shown in FIG. 11. The read reclaim module 2000 may perform a word line reclaim operation using cache memory.

In operation S310, the read reclaim module 2000 may select WLk. WLk may be a selected word line that repeatedly performs a read operation through a hot spot read pattern.

In operation S320, the read reclaim module 2000 may determine the level of degradation of WLk+1. The read reclaim module 2000 may determine whether the adjacent word line WLk+1 is a deteriorated word lines. For example, deterioration of the adjacent word line WLk+1 may be determined using the number of error bits or read counts of memory cells connected to the adjacent word line WLk+1.

As described in FIG. 9, the read reclaim module 2000 may determine deterioration if the number of error bits in an adjacent word line is greater than the first threshold Th1. Alternatively, the read reclaim module 2000 may determine deterioration if the read count of an adjacent word line is greater than the second threshold Th2, as described in FIG. 10. The read reclaim module 2000 may not perform a word line reclaim operation if an adjacent word lines WLk+1 is not deteriorated (NO). If the adjacent word line WLk+1 is deteriorated, the read reclaim module 2000 may perform operation S330 (YES).

In operation S330, the read reclaim module 2000 may determine whether the selected word line WLk is a hot spot read word line. The read reclaim module 2000 may receive a read request from the host and determine whether the selected word line WLk is a hot spot read word line. The read reclaim module 2000 may not perform a word line reclaim operation if the selected word line WLk is not a hot spot read word line (NO). The read reclaim module 2000 may perform a word line reclaim operation (i.e., operation S340) if the selected word line WLk is a hot spot read word line (YES).

In operation S340, the read reclaim module 2000 may perform a word line reclaim operation for the adjacent word lines WLk+1. If a read operation for the selected word line WLk is repeatedly performed through a hot spot read pattern, deterioration due to a read disturbance at the adjacent word lines WLk+1 may progress rapidly. The read reclaim module 2000 may determine a hot spot read pattern through the deterioration level of the selected word line WLk and perform a word line reclaim operation for the adjacent word lines WLk+1.

In operation S350, the read reclaim module 2000 may move the data of the selected word line WLk to the cache memory 1250. The read reclaim module 2000 may perform a word line reclaim operation for the adjacent word lines WLk+1 and then store the data of the selected word line WLk in the cache memory 1250. The cache memory 1250 may store the data of the selected word line WLk that is repeatedly read during a hot spot read operation. The memory controller 1200 may increase read speed and effectively reduce read disturbance of unselected word lines uWL.

Figure 13:
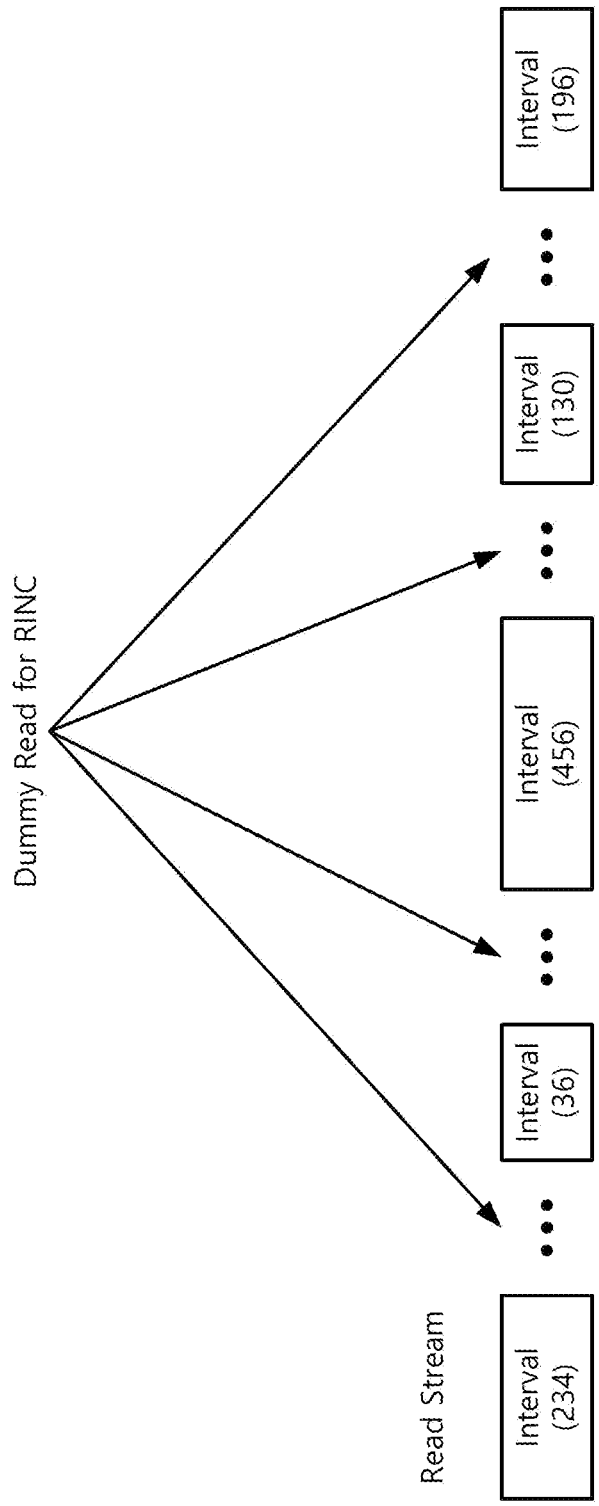
FIG. 13 is a diagram illustrating the random interval neighbor check (RINC) operation of a memory device according to example embodiments of the present disclosure.

FIG. 13 is a diagram illustrating the RINC operation of a memory device according to example embodiments of the present disclosure. The read reclaim module 2000 may perform a random interval neighbor check (RINC) operation.

The RINC operation may refer to a reliability verification operation performed based on environmental information such as the number of error bits or a read count. Here, the environmental information may include a program-erase cycle, a program count, an erase count, the number of error bits generated during a read operation, an error rate, threshold voltage change information, wear level information, degradation information, data input/output time information, temperature information, location information, structure information, status information of adjacent cells, etc.

The RINC operation may be a dummy read operation of at least one adjacent word line or at least one open word line. An open word line may refer to an unselected word line on which no program operation has been performed. When there is a read request from the host, whether to perform a read reclaim operation may be determined based on degradation information such as the number of error bits and/or read count of the corresponding memory block.

For example, the RINC operation may perform a read reclaim operation when the read count exceeds a predetermined value. Here, the predetermined value may be a random value with a distribution. For example, the predetermined value may be an average value for predetermined units. This predetermined value may change during each read reclaim operation.

Referring to FIG. 13, the storage device 1000 may perform a dummy read operation for RINC. Here, the dummy read operation may be part of a reliability verification operation (RINC operation). Unlike performing a dummy read operation according to a read count in a predetermined unit, the dummy read operation may be performed in variable units.

For example, in a read stream, the first dummy read operation may be performed after the interval with a read count of 234. The second dummy read operation may be performed after the interval with a read count of 36. The third dummy read operation may be performed after the interval with a read count of 456. And the fourth dummy read operation may be performed after the interval where the read count is 130. The fourth dummy read operation may be performed before the interval where the read count is 196.

The dummy read operation may be managed differently depending on the program-erase cycle of the memory block. Depending on the program-erase cycle, the initial read count of the dummy read operation or the interval of the dummy read operation may vary. Additionally, the dummy read operation may be managed differently depending on the area of the memory cell. For example, the initial read count of the dummy read operation or the interval of the dummy read operation may be different depending on the single level cell (SLC) area, multi-level cell (MLC) area, and triple level cell (TLC) area.

Figure 14:
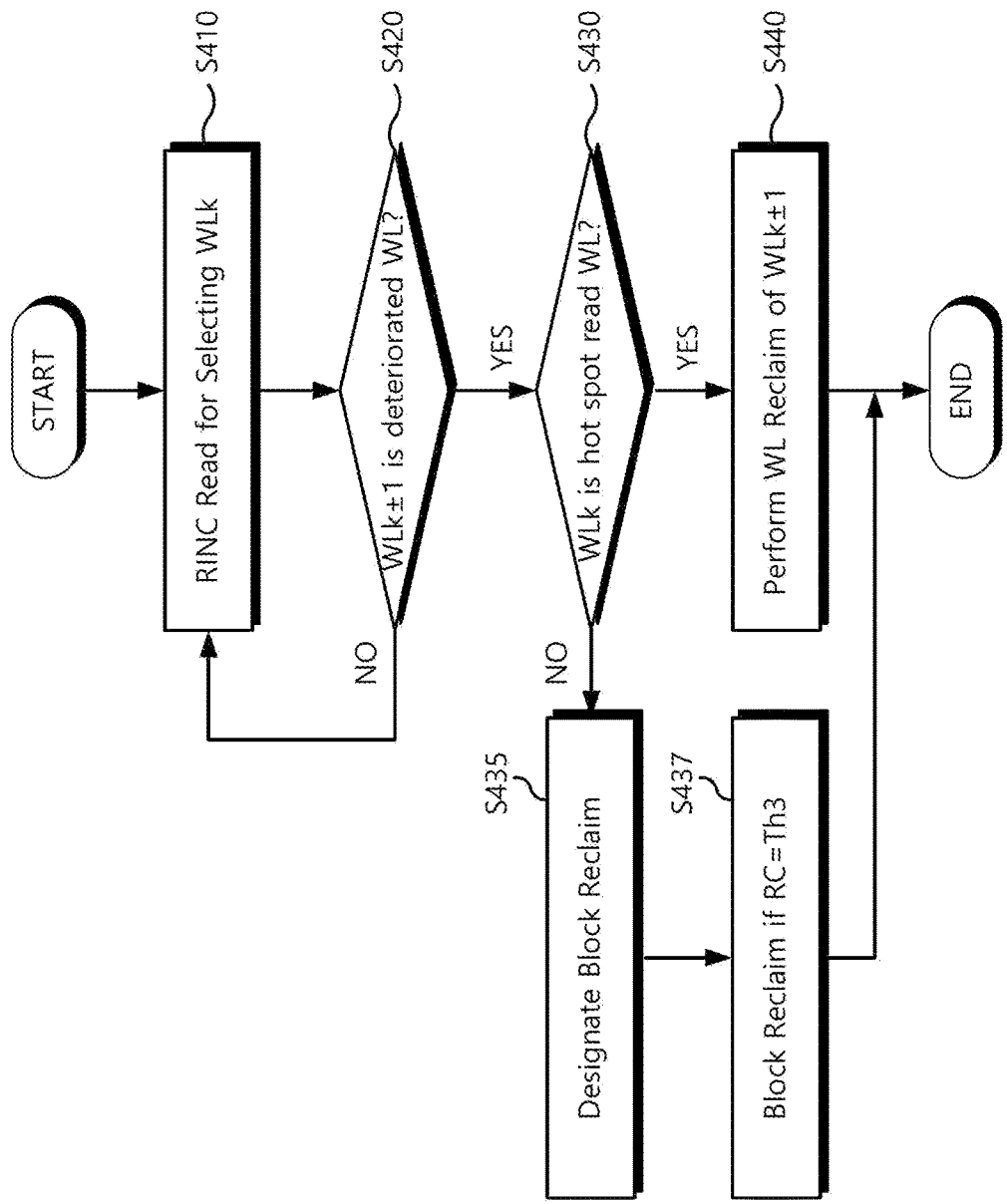
FIG. 14 is a flowchart illustrating the RINC operation of a storage device according to example embodiments of the present disclosure.

FIG. 14 is a flowchart illustrating the RINC operation of a storage device according to example embodiments of the present disclosure. FIG. 14 shows the RINC operation to check a read disturbance and perform a word line reclaim.

When there are repeated read requests from the host, data stored in the flash memory 1100 may cause a read disturbance. The flash memory 1100 may perform a RINC operation to prevent a read failure due to a read disturbance. The flash memory 1100 may check the deterioration state of memory cells and determine whether to perform a read reclaim operation. If the memory cells are determined to be sufficiently deteriorated, the flash memory 1100 may reduce a read disturbance by re-writing data to another memory block through a read reclaim operation.

In operation S410, the read reclaim module 2000 may perform a RINC read operation to select WLk. WLk may be a selected word line that repeatedly performs a read operation through a hot spot read pattern. When a read operation is performed through a hot spot read pattern, a select read voltage Vrd may be repeatedly provided to the selected word line WLk.

In operation S420, the read reclaim module 2000 may determine whether an adjacent word line WLk+1 is a deteriorated word line. For example, whether an adjacent word line is deteriorated may be determined using the number of error bits or read counts of memory cells connected to the adjacent word line. The read reclaim module 2000 may repeatedly perform operation S410 if the adjacent word line WLk+1 is not a deteriorated word line (NO). The read reclaim module 2000 may perform operation S430 when the adjacent word line WLk+1 deteriorates (YES).

In operation S430, the read reclaim module 2000 may determine whether the selected word line WLk is a hot spot read word line. The read reclaim module 2000 may receive a read request from the host and determine whether the selected word linen WLk is a hot spot read word line. If the selected word line WLk is not a hot spot read word line, the read reclaim module 2000 may perform a block reclaim operation without performing a word line reclaim operation.

In operation S435, the read reclaim module 2000 may register a block reclaim when the selected word line WLk is not a hot spot read word line. In operation S437, the read reclaim module 2000 may perform a block reclaim operation if the read count of the selected word line WLk is equal to the third threshold Th3.

In operation S440, if the selected word line WLk is a hot spot read word line, the read reclaim module 2000 may perform a word line reclaim operation for the adjacent word line WLk+1. The read reclaim module 2000 may determine a hot spot read pattern through the deterioration level of the selected word line WLk and perform a word line reclaim operation for the adjacent word line WLk+1. The read reclaim module 2000 may reduce WAF and increase QoS by performing a reclaim operation only for the deteriorated adjacent word line WLk+1.

Figure 15:
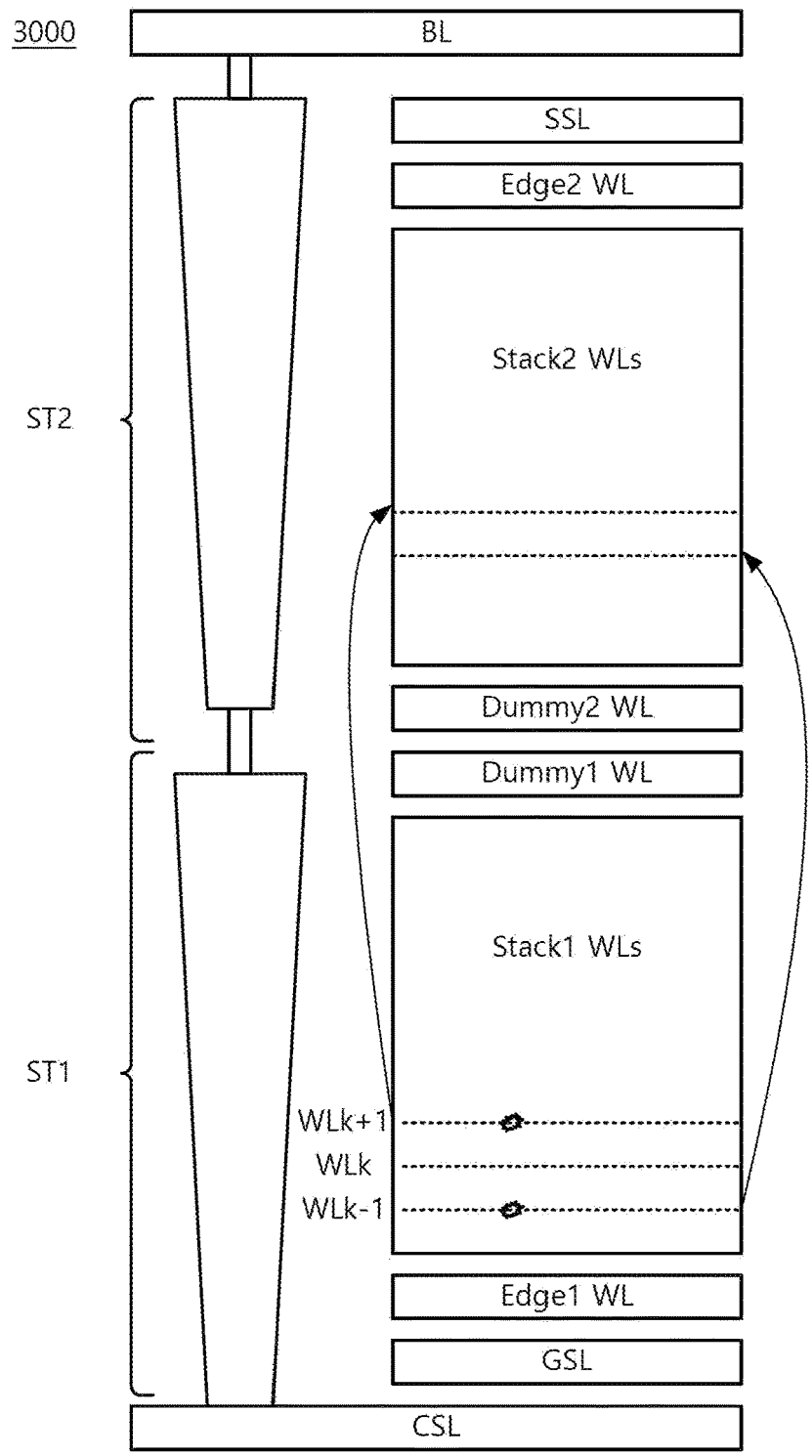
FIG. 15 is a diagram illustrating an example embodiment of a flash memory having a multi-stack structure.

FIG. 15 is a diagram illustrating an example embodiment of a flash memory having a multi-stack structure. Referring to FIG. 15, the flash memory 3000 may have a first stack ST1 and a second stack ST2. The first stack ST1 may be located at the bottom, and the second stack ST2 may be located at the top.

A pillar of the flash memory 3000 may be formed by bonding the first and second stacks ST1 and ST2. A plurality of dummy word lines (e.g., Dummy1 WL and Dummy2 WL) may be included at junctions of the first and second stacks ST1 and ST2. The first stack ST1 may be positioned between the common source line CSL and the first dummy word line Dummy1 WL. The second stack ST2 may be positioned between the second dummy word line Dummy2 WL and the bit line BL.

The first stack ST1 may include a ground selection line GSL, a first edge word line Edge1 WL, and first stack word lines Stack1 WLs. The second stack ST2 may include a string selection line SSL, second stack word lines Stack2 WLs and second edge word lines Edge2 WL. Memory cells connected to the first and second edge word lines Edge1 WL and Edge2 WL may store bit data different from the other memory cells. For example, memory cells connected to the first and second edge word lines Edge1 WL and Edge2 WL may be SLC or MLC, and memory cells connected to the other word lines may be TCL or QLC.

If the selected word line WLk of the first stack ST1 is a hot spot read word line, the read reclaim module 2000 may perform a word line reclaim operation for the adjacent word line WLk+1. The read reclaim module 2000 may determine a hot spot read pattern through the deterioration level of the selected word line WLk and perform a word line reclaim operation for the adjacent word line WLk+1.

The read reclaim module 2000 may move data stored in the deteriorated adjacent word line WLk+1 of the first stack ST1 to a predetermined word line of the second stack ST2 through a word line reclaim operation. The read reclaim module 2000 may reduce WAF and increase QoS by performing a word line reclaim operation in a flash memory with a multi-stack structure.

Figure 16:
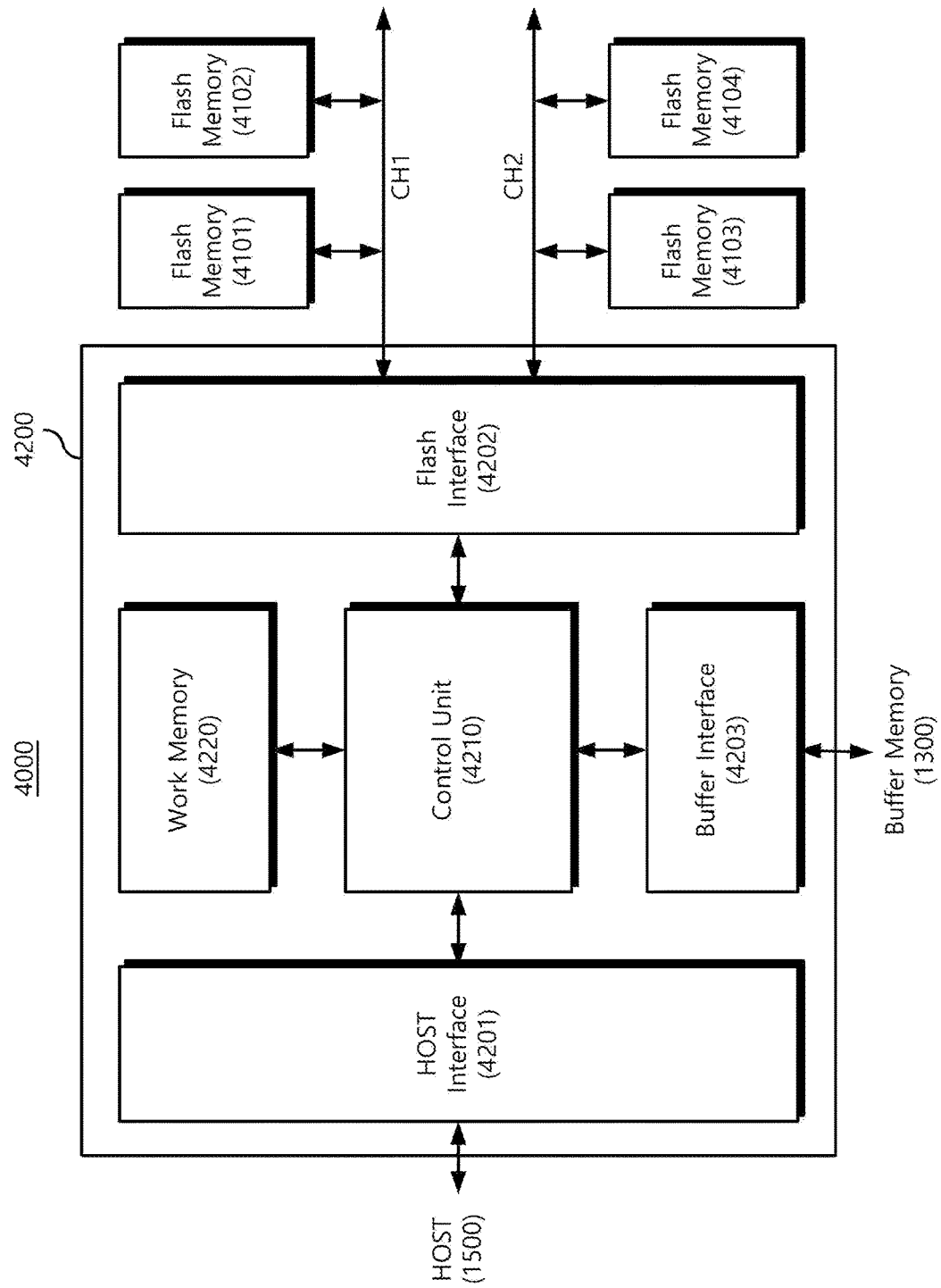
FIG. 16 is a block diagram illustrating an example of a storage device implemented as a solid state drive (SSD) according to example embodiments of the present disclosure.

FIG. 16 is a block diagram illustrating an example of a storage device implemented as a solid state drive (SSD) according to example embodiments of the present disclosure. Referring to FIG. 16, the SSD 4000 includes a plurality of flash memories 4101 to 4104 and an SSD controller 4000.

The first and second flash memories 4101 and 4102 may be connected to the SSD controller 4200 through a first channel (CH1). The third and fourth flash memories 4103 and 4104 may be connected to the SSD controller 4200 through a second channel (CH2). The number of channels connected to the SSD controller 4200 may be more than two. And the number of flash memories connected to one channel may be more than two.

The SSD controller 4200 may include a host interface 4201, a flash interface 4202, a buffer interface 4203, a control unit 4210, and a work memory 4220. The SSD controller 4200 may be connected to the host 1500 through the host interface 4201. The SSD controller 4200 may write data to or read data from the flash memory at the request of the host 1500.

The SSD controller 4200 may be connected to the plurality of flash memories 4101 to 4104 through the flash interface 4202 and with a buffer memory 1300 through the buffer interface 4203. The flash interface 4202 may provide data temporarily stored in the buffer memory 1300 to the flash memory through the respective channels CH1 and CH2. And the flash interface 4202 may transfer data read from the flash memories 4101 to 4104 to the buffer memory 1300.

The control unit 4210 may analyze and process signals input from the host 1500. The control unit 4210 may control the host 1500 or the flash memories 4101 to 4104 through the host interface 4201 or the flash interface 4202. The control unit 4210 may control the operation of the flash memories 4101 to 4104 according to firmware for driving the SSD 4000.

The SSD controller 4200 may manage data to be stored in flash memories 4101 to 4104. During a sudden power-off operation, the SSD controller 4200 may back up data stored in the work memory 4220 or the buffer memory 1300 to the flash memories 4101 to 4104.

The SSD controller 4200 may include the read reclaim module 2000 described above within the control unit 4210. The read reclaim module 2000 may perform a word line reclaim operation within each flash memory 4101 to 4104 or between different flash memories. The read reclaim module 2000 may determine a hot spot read pattern based on the deterioration level of a selected word line and perform a word line reclaim operation for an adjacent word line.

The storage device according to example embodiments of the present disclosure may determine whether a hot spot read operation is performed based on the deterioration level of a selected word line and perform a word line reclaim operation for an adjacent word line. According to the present disclosure, it is possible to reduce WAF and increase QoS by performing a reclaim operation only on deteriorated adjacent word lines.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A storage device comprising:
a flash memory including a selected word line and an adjacent word line adjacent to the selected word line; and
a memory controller configured to provide a select read voltage to the selected word line and a pass voltage to the adjacent word line during a read operation, the pass voltage being higher than the select read voltage, and
wherein the memory controller is further configured to determine whether the selected word line is a hot spot read word line based on a deterioration level of the adjacent word line, and perform a word line reclaim operation for the adjacent word line when the selected word line is the hot spot read word line.

2. The storage device of claim 1,
wherein the flash memory includes:
a first memory block including the selected word line and the adjacent word line; and
a second memory block to which data of the adjacent word line is moved during the word line reclaim operation.

3. The storage device of claim 2,
wherein the memory controller determines a hot spot read operation of the selected word line based on the number of error bits of the adjacent word line.

4. The storage device of claim 2,
wherein the memory controller determines a hot spot read operation of the selected word line based on a read count of the adjacent word line.

5. The storage device of claim 2,
wherein the memory controller further includes cache memory, and
wherein the memory controller performs the word line reclaim operation, and then, moves data of the selected word line to the cache memory.

6. The storage device of claim 5,
wherein the memory controller determines a hot spot read operation of the selected word line based on the number of error bits or a read count of the adjacent word line.

7. The storage device of claim 2,
wherein the memory controller moves data of the first memory block to the second memory block through a block reclaim operation when the selected word line is not the hot spot read word line.

8. The storage device of claim 7,
wherein the memory controller includes a read reclaim module, and
wherein the read reclaim module moves data of the first memory block to the second memory block through a block reclaim operation when a read count of the selected word line reaches a predefined threshold if the selected word line is not the hot spot read word line.

9. The storage device of claim 2,
wherein the memory controller includes a garbage collection module, and
wherein the garbage collection module moves data of the first memory block to the second memory block through a block reclaim operation when a read count of the selected word line reaches a predefined threshold if the selected word line is not the hot spot read word line.

10. The storage device of claim 2,
wherein the flash memory has a multi-stack structure,
wherein the first memory block is in a first stack, and
wherein the second memory block is in a second stack located on top of the first stack.

11. A storage device comprising:
a flash memory including a first word line and a second word line adjacent to the first word line; and
a memory controller configured to provide a select read voltage to the first word line and a pass voltage to the second word line during a read operation, the pass voltage being higher than the select read voltage,
wherein the memory controller is further configured to determine whether the first word line is a hot spot read word line based on a deterioration level of the second word line, and perform a block reclaim operation or a word line reclaim operation based on whether the first word line is the hot spot read word line or not.

12. The storage device of claim 11,
wherein the memory controller performs the word line reclaim operation when the first word line is the hot spot read word line, and performs the block reclaim operation when the first word line is not the hot spot read word line.

13. The storage device of claim 11, wherein the memory controller is a storage device that determines whether to read a hot spot of the first word line based on the number of error bits of the second word line.

14. The storage device of claim 11, wherein the memory controller determines a hot spot read operation of the first word line based on a read count of the second word line.

15. The storage device of claim 11, wherein the memory controller further includes cache memory, and wherein the memory controller performs the word line reclaim operation, and then moves data of the first word line to the cache memory.

16. A reclaim operation method of a storage device including a flash memory, the method comprising:
    determining whether a second word line adjacent to a first word line of the flash memory is a deteriorated word line;
    determining whether the first word line is a hot spot read word line when the second word line is the deteriorated word line; and
    performing a word line reclaim operation on the second word line when the first word line is the hot spot read word line.

17. The method of claim 16, further comprising:
    performing a block reclaim operation when the first word line is not the hot spot read word line.

18. The method of claim 16, further comprising:
    determining whether the second word line is deteriorated based on the number of error bits of the second word line.

19. The method of claim 16, further comprising:
    determining whether the second word line is deteriorated based on a read count of the second word line.

20. The method of claim 16, further comprising:
    moving data of the first word line to a cache memory after performing the word line reclaim operation on the second word line.

* * * * *